(12) United States Patent
Choi et al.

(10) Patent No.: US 11,545,964 B2
(45) Date of Patent: Jan. 3, 2023

(54) HIGH SPEED FLIPFLOP CIRCUIT

(71) Applicant: SAMSUNG ELECTRONICS CO., LTD., Suwon-si (KR)

(72) Inventors: Wonhyun Choi, Hwaseong-si (KR); Hyunchul Hwang, Suwon-si (KR); Minsu Kim, Hwaseong-si (KR)

(73) Assignee: SAMSUNG ELECTRONICS CO., LTD., Suwon (KR)

( * ) Notice: Subject to any disclaimer, the term of this patent is extended or adjusted under 35 U.S.C. 154(b) by 188 days.

(21) Appl. No.: 17/025,511

(22) Filed: Sep. 18, 2020

(65) Prior Publication Data

US 2021/0270899 A1 Sep. 2, 2021

(30) Foreign Application Priority Data

Feb. 27, 2020 (KR) ........................ 10-2020-0024550

(51) Int. Cl.
| | |
|---|---|
| *H03K 3/037* | (2006.01) |
| *G01R 31/3185* | (2006.01) |
| *G01R 31/3177* | (2006.01) |
| *G06F 1/10* | (2006.01) |
| *H03K 3/356* | (2006.01) |

(52) U.S. Cl.
CPC ......... *H03K 3/037* (2013.01); *G01R 31/3177* (2013.01); *G01R 31/318541* (2013.01); *G01R 31/318583* (2013.01); *G06F 1/10* (2013.01); *H03K 3/356104* (2013.01); *H03K 3/356121* (2013.01)

(58) Field of Classification Search
CPC ........ H03K 3/027; H03K 3/037; H03K 3/353; H03K 3/356; H03K 3/356069; H03K 3/356078; H03K 3/356086; H03K 3/356104; H03K 3/356113; H03K 3/356121; H03K 3/356165; H03K 3/356173; H03K 3/356182; H03K 3/356191; G06F 1/10; G01R 31/3177; G01R 31/318533; G01R 31/318541; G01R 31/318583

See application file for complete search history.

(56) References Cited

U.S. PATENT DOCUMENTS

| | | |
|---|---|---|
| 6,972,605 B1 | 12/2005 | Choe |
| 7,479,806 B2 | 1/2009 | Teh et al. |
| 8,030,969 B2 | 10/2011 | Sumita |

(Continued)

FOREIGN PATENT DOCUMENTS

| | | |
|---|---|---|
| JP | 4713130 B2 | 6/2011 |
| JP | 5224657 B2 | 7/2013 |

*Primary Examiner* — Long Nguyen
(74) *Attorney, Agent, or Firm* — Sughrue Mion, PLLC

(57) ABSTRACT

High-speed flipflop circuits are disclosed. The flipflop circuit may latch a data input signal or a scan input signal using a first signal, a second signal, a third signal, and a fourth signal generated inside the flipflop circuit, and may output an output signal and an inverted output signal. The flipflop circuit includes a first signal generation circuit configured to generate the first signal; a second signal generation circuit configured to generate the second signal; a third signal generation circuit configured to receive the second signal and generate the third signal; and an output circuit configured to receive the clock signal and the second signal, and output an output signal and an inverted output signal.

20 Claims, 20 Drawing Sheets

(56) References Cited

U.S. PATENT DOCUMENTS

| | | |
|---|---|---|
| 8,508,275 B2 | 8/2013 | Sathianthan |
| 8,667,349 B2 | 3/2014 | Hsieh et al. |
| 9,612,281 B2 | 4/2017 | Lou et al. |
| 10,938,383 B2 * | 3/2021 | Hwang .................. H03K 5/135 |
| 2017/0302279 A1 * | 10/2017 | Hwang .............. H03K 19/0016 |
| 2018/0123569 A1 | 5/2018 | Hwang et al. |

* cited by examiner

10

10

10

HIGH SPEED FLIPFLOP CIRCUIT

CROSS-REFERENCE TO THE RELATED APPLICATION

This application is based on and claims priority from Korean Patent Application No. 10-2020-0024550, filed on Feb. 27, 2020, in the Korean Intellectual Property Office, the disclosure of which is incorporated herein in its entirety by reference.

BACKGROUND

The inventive concept is applied to a flipflop circuit, and more particularly, to a high-speed flipflop circuit of a new structure to be used in a semiconductor integrated circuit.

As a semiconductor integrated circuit becomes high-performance and highly integrated, it takes a lot of time and resources to test the semiconductor integrated circuit. In order to improve test efficiency while maintaining the quality of the semiconductor integrated circuit, design for testability (DFT) technology is used. The DFT technology uses a scan cell method in which a flipflop is constructed inside the semiconductor integrated circuit as a series of shift registers for test purposes. In the scan cell method, data are sequentially transferred through a data path during a normal operation, and test data (or scan data) are applied through a scan path during a test operation to observe an output value of the flipflop. The flipflop having a scan input to be used in the scan cell method tests a logic circuit part in the semiconductor integrated circuit by receiving a scan input signal for testing, and the flipflop is designed considering the test from the beginning of the design to facilitate the test. In addition, the operation of a flipflop transferring data according to a clock signal is directly related to the performance of the semiconductor integrated circuit.

Accordingly, there is a need for a high-performance and high-integration semiconductor integrated circuit and a high-speed flipflop with a new structure suitable for DFT.

SUMMARY

Example embodiments of the inventive concept provide high-speed flipflop circuits with an improved structure.

According to an aspect of the embodiments, there is provided a flipflop circuit which may include: a clock circuit configured to receive a clock signal and output an inverted clock signal; a first signal generation circuit configured to receive the inverted clock signal, a data input signal, a first signal, and a third signal, and generate the first signal; a second signal generation circuit configured to receive the clock signal, the inverted clock signal, the data input signal, the first signal, and the third signal, and generate a second signal; a third signal generation circuit configured to receive the second signal, and generate the third signal; and an output circuit configured to receive the clock signal and the second signal, and output an output signal and an inverted output signal, wherein the second signal generation circuit is configured to discharge a second signal line to which the second signal is output, by using a fourth signal derived from the first signal.

According to an aspect of the embodiments, there is provided a flipflop circuit which may include: a clock circuit configured to receive a clock signal, and output an inverted clock signal; a scan enable circuit configured to receive a scan enable signal, and output an inverted scan enable signal; a first signal generation circuit configured to receive a scan input signal, the inverted scan enable signal, the clock signal, the inverted clock signal, a data input signal, the first signal, and the third signal, and generate a first signal; a second signal generation circuit configured to receive the clock signal, the data input signal, the first signal, and the third signal, and generate a second signal; a third signal generation circuit configured to receive the inverted scan enable signal and the second signal and generate the third signal; and an output circuit configured to receive the clock signal and the second signal, and output an output signal and an inverted output signal, wherein the second signal generation circuit is configured to discharge a second signal line to which the second signal is output, by using the first signal.

According to an aspect of the embodiments, there is provided a flipflop circuit including: a clock circuit configured to receive a clock signal and output an inverted clock signal; a scan enable circuit configured to receive a scan enable signal, and output an inverted scan enable signal; a first signal generation circuit configured to receive a scan input signal, the inverted scan enable signal, the clock signal, the inverted clock signal, a data input signal, the first signal, and the third signal, and generate a first signal; a second signal generation circuit configured to receive the clock signal, the inverted clock signal, the data input signal, the first signal, and the third signal, and generate a second signal; a third signal generation circuit configured to receive the inverted scan enable signal and the second signal, and generate the third signal; and an output circuit configured to receive the clock signal and the second signal, and output an output signal and an inverted output signal, wherein the second signal generation circuit is configured to discharge a second signal line to which the second signal is output, by using a fourth signal derived from the first signal.

BRIEF DESCRIPTION OF THE DRAWINGS

Embodiments will be more clearly understood from the following detailed description taken in conjunction with the accompanying drawings in which.

DETAILED DESCRIPTION

The embodiments described herebelow are all example embodiments, and thus, the inventive concept is not limited to these embodiments and may be realized in various other forms. Each of these embodiments is not excluded from being associated with one or more features of another example or another embodiment also provided herein or not provided herein but consistent with the inventive concept. For example, even if matters described in a specific example or embodiment are not described in a different example or embodiment, the matters may be understood as being related to or combined with the different example or embodiment, unless otherwise mentioned in descriptions thereof.

Figure 1:
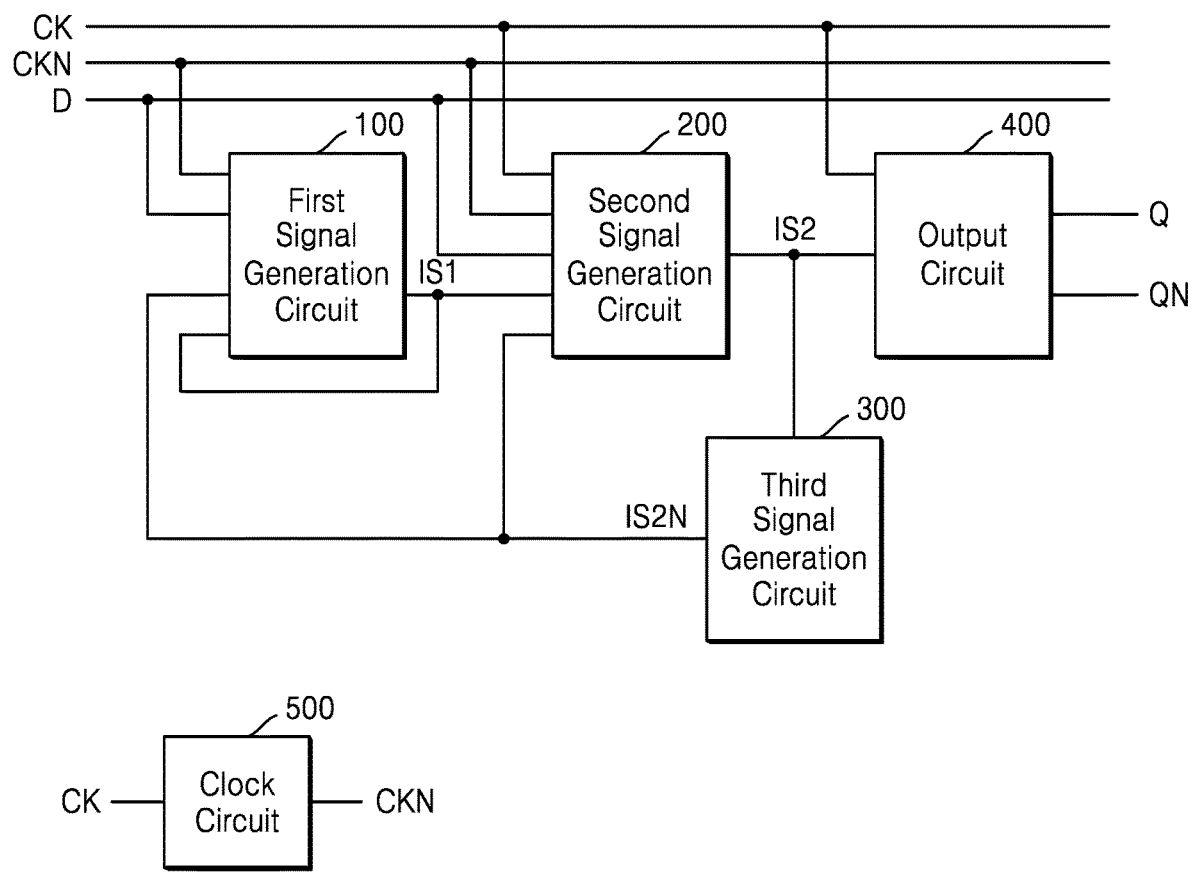
FIG. 1 is a diagram of a first example illustrating a flipflop circuit according to an embodiment.

FIG. 1 is a diagram of a first example illustrating a flipflop circuit according to an embodiment. In the following, it is noted that subscripts attached to reference numbers (for example, a in 10a and _5 in 200_5) may be used to distinguish multiple circuits having the same function.

Referring to FIG. 1, a flipflop circuit 10 may include a first signal generation circuit 100, a second signal generation circuit 200, a third signal generation circuit 300, and an output circuit 400. In addition, the flipflop circuit 10 may include a clock circuit 500 that receives a clock signal CK and outputs an inverted clock signal CKN.

The first signal generation circuit 100 may receive the inverted clock signal CKN, a data input signal D, a first signal IS1, and a third signal IS2N, and generate the first signal IS1. The second signal generation circuit 200 may receive the clock signal CK, the inverted clock signal CKN, the data input signal D, the first signal IS1, and the third signal IS2N, and generate the second signal IS2. The second signal generation circuit 200 may be configured to discharge a second signal IS2 line to which the second signal IS2 is output, by using a fourth signal IS1P derived from the first signal IS1. The third signal generation circuit 300 may receive the second signal IS2 and generate the third signal IS2N. The output circuit 400 may receive the clock signal CK and the second signal IS2, and output an output signal Q and an inverted output signal QN.

Figure 2:
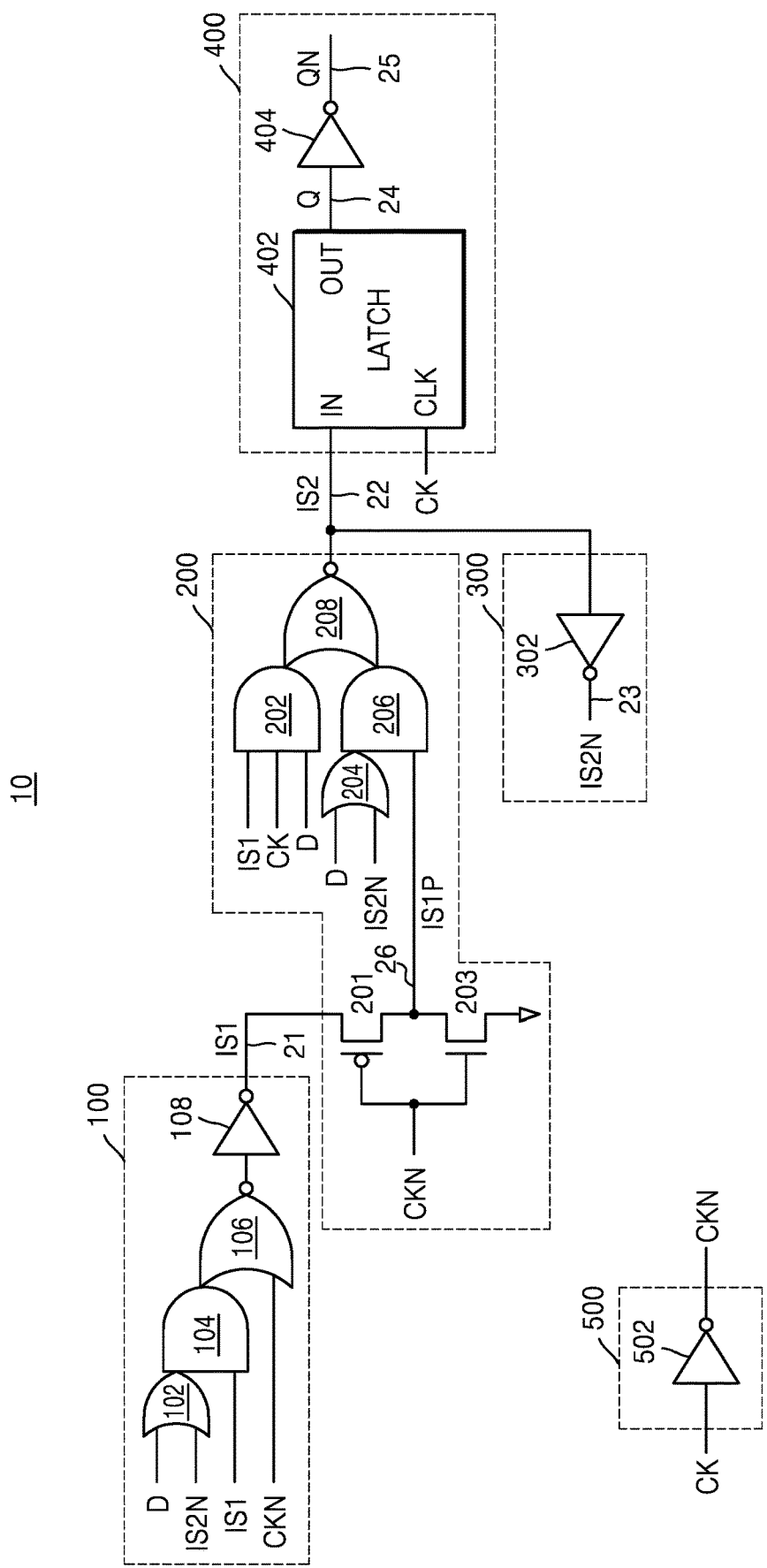
FIG. 2 illustrates a logic diagram of the flipflop circuit of FIG. 1.

FIG. 2 illustrates a logic diagram of the flipflop circuit 10 of FIG. 1.

Referring to FIG. 2, the flipflop circuit 10 may include a first node 21 line to which the first signal IS1 generated in the first signal generation circuit 100 is output, a second node 22 line to which the second signal IS2 generated in the second signal generation circuit 200 is output, a third node 23 line to which the third signal IS2N generated in the third signal generation circuit 300 is output, a fourth node 24 line to which the output signal Q of the output circuit 400 is output, and a fifth node 25 line to which the inverted output signal QN is output. The clock circuit 500 may be configured with an inverter 502 that may receive the clock signal CK and output the inverted clock signal CKN. An input of the inverter 502 may be connected to the clock signal CK line, and an output of the inverter 502 may be connected to the inverted clock signal CKN line.

The first signal generation circuit 100 may be connected to the data input signal D line, the third signal IS2N line, the first signal IS1 line, the inverted clock signal CKN line, and the first node 21 line, and may include a complex gate including an OR gate 102, an AND gate 104, a NOR gate 106, and an inverter 108.

The OR gate 102 may include a first input that receives the data input signal D, a second input that receives the third signal IS2N, and an output. The AND gate 104 may include a first input that receives the output of the OR gate 102, a second input that receives the first signal IS1, and an output. The NOR gate 106 may include a first input that receives the output of the AND gate 104, a second input that receives the inverted clock signal CKN, and an output. The inverter 108 may include an input that receives the output of the NOR gate 106, and an output that generates the first signal IS1.

The output of the inverter 108 may be connected to the first node 21 line, and the first signal IS1 may be output to the first node 21 line. The first node 21 line may be referred to as the first signal IS1 line.

The second signal generation circuit 200 may be connected to the first signal IS1 line, the clock signal CK line, the data input signal D line, the inverted clock signal CKN line, and the third signal IS2N line, and may include a complex gate including a first AND gate 202, an OR gate 204, a second AND gate 206, and a NOR gate 208, and may also include a P-type metal-oxide-semiconductor (PMOS) transistor 201 and an N-type metal-oxide-semiconductor (NMOS) transistor 203.

The first AND gate 202 may include a first input that receives the first signal IS1, a second input that receives the clock signal CK, a third input that receives the data input signal D, and an output. The OR gate 204 may include a first input that receives the data input signal D, a second input that receives the third signal IS2N, and an output. The PMOS transistor 201 and the NMOS transistor 203 may be connected in series between the first signal IS1 line and the ground voltage VSS line, and gates of the PMOS transistor 201 and the NMOS transistor 203 may be connected to the inverted clock signal CKN line. The fourth signal IS1P may be output to a connection node 26 line between the PMOS transistor 201 and the NMOS transistor 203. The connection node 26 line may be referred to as a fourth signal IS1P line. The second AND gate 206 may include a first input that receives the output of the OR gate 204, a second input that receives the fourth signal IS1P, and an output. The NOR gate 208 may include a first input that receives the output of the first AND gate 202, a second input that receives the output of the second AND gate 206, and an output. The output of the NOR gate 208 may be connected to the second node 22 line, and the second signal IS2 may be output to the second node 22 line. The second node 22 line may be referred to as the second signal IS2 line.

The third signal generation circuit 300 may include an inverter 302 connected to the second signal IS2 line and the third signal IS2N line. The inverter 302 may include an input that receives the second signal IS2 and an output that generates the third signal IS2N. The output of the inverter 302 may be connected to the third node 23 line, and the third signal IS2N may be output to the third node 23 line. The third node 23 line may be referred to as the third signal IS2N line. The third signal generation circuit 300 may invert the second signal IS2 and output the third signal IS2N.

The output circuit 400 may be connected to the second signal IS2 line, the clock signal CK line, an output signal Q line, and an inverted output signal QN line, and may include a latch circuit 402 and an inverter 404.

The latch circuit 402 may include an input terminal that receives the second signal IS2, a clock terminal that receives the clock signal CK, and an output terminal. The latch circuit 402 may latch a logic level of the second signal IS2 in response to a rising edge of the clock signal CK, and may output the output signal Q to the fourth node 24 line connected to the output terminal. The inverter 404 may include an input that receives the output signal Q and an output that outputs the inverted output signal QN. The output of the inverter 404 may be connected to the fifth node 25 line, and the inverted output signal QN may be output to the fifth node 25 line. The fourth node 24 line may be referred to as the output signal Q line, and the fifth node 25 line may be referred to as the inverted output signal QN line.

Figure 3:
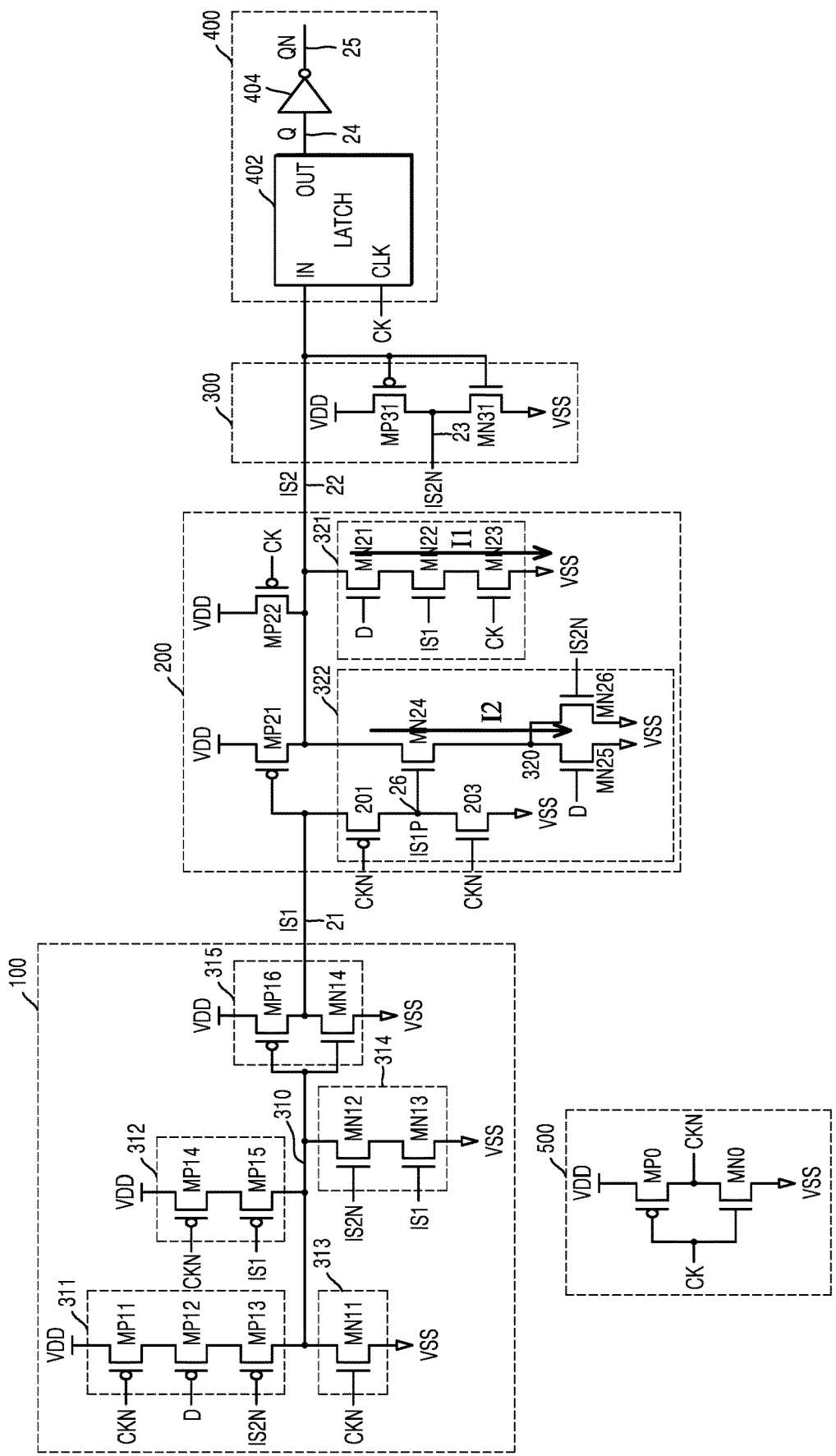
FIG. 3 illustrates a circuit diagram of the flipflop circuit of FIG. 1.

FIG. 3 illustrates a circuit diagram of the flipflop circuit 10 of FIG. 1.

Referring to FIG. 3, the flipflop circuit 10 may include the first signal generation circuit 100, the second signal generation circuit 200, the third signal generation circuit 300, and the clock circuit 500, which may be formed of a plurality of transistors. The output circuit 400 may include the latch circuit 402 and the inverter 404 as shown in the logic diagram of FIG. 2. The clock circuit 500 may include a PMOS transistor MPO and an NMOS transistor MNO connected between a power supply voltage VDD line and a ground voltage VSS line. Gates of the PMOS transistor MPO and the NMOS transistor MNO may be connected to the clock signal CK line, and a connection node between the PMOS transistor MPO and the NMOS transistor MNO may be connected to the inverted clock signal CKN line.

The first signal generation circuit 100 may include a plurality of stacks of transistors, for example, first, second, third, and fourth stacks 311, 312, 313, and 314, which are respectively connected to the power supply voltage VDD line and the ground voltage VSS line, and the stacks of transistors, that is, the first, second, third, and fourth stacks 311, 312, 313, and 314, may be commonly connected to a data node 310 line. In addition, the first signal generation circuit 100 may include an inverter 315 connected between the data node 310 line and the first node 21 line.

The first stack 311 of transistors may include PMOS transistors MP11, MP12, and MP13 connected in series between the power supply voltage VDD line and the data node 310 line. A gate of the MP11 transistor may be connected to the inverted clock signal CKN line, a gate of the MP12 transistor may be connected to the data input signal D line, and a gate of the MP13 transistor may be connected to the third signal IS2N line.

The second stack 312 of transistors may include PMOS transistors MP14 and MP15 connected in series between the power supply voltage VDD line and the data node 310 line. A gate of the MP14 transistor may be connected to the inverted clock signal CKN line, and a gate of the MP15 transistor may be connected to the first signal IS1 line.

The third stack 313 of transistors may include an NMOS transistor MN11 connected between the data node 310 line and the ground voltage VSS line. A gate of the MN11 transistor may be connected to the inverted clock signal CKN line.

The fourth stack 314 of transistors may include NMOS transistors MN12 and MN13 connected in series between the data node 310 line and the ground voltage VSS line. A gate of the MN12 transistor may be connected to the third signal IS2N line, and a gate of the MN13 transistor may be connected to the first signal IS1 line.

The inverter 315 may include a PMOS transistor MP16 and an NMOS transistor MN14 connected between the power supply voltage VDD line and the ground voltage VSS line. Gates of the MP16 transistor and the MN14 transistor may be connected to the data node 310 line, and a connection node between the MP16 transistor and the MN14 transistor may be connected to the first node 21 line. The inverter 315 may receive a signal of the data node 310 line and output the first signal IS1 to the first node 21 line.

The second signal generation circuit 200 may include PMOS transistors MP21 and MP22 connected in parallel between the power supply voltage VDD line and the second signal IS2 line, and may further include stacks of transistors, for example, first and second stacks 321 and 322 of transistors connected between the second signal IS2 line and the ground voltage VSS line, and between the first signal IS1 line and the ground voltage VSS line. A gate of the MP21 transistor may be connected to the first signal IS1 line, and a gate of the MP22 transistor may be connected to the clock signal CK line.

The first stack 321 of transistors may include NMOS transistors MN21, MN22, and MN23 connected in series between the second signal IS2 line and the ground voltage VSS line. A gate of the MN21 transistor may be connected to the data input signal D line, a gate of the MN22 transistor may be connected to the first signal IS1 line, and a gate of the MN23 transistor may be connected to the clock signal CK line.

The second stack 322 of transistors may include a PMOS transistor 201 and an NMOS transistor 203, MN24, MN25, and MN26, which are connected to the first signal IS1 line, the second signal IS2 line, and the ground voltage VSS line, respectively. The PMOS transistor 201 and the NMOS transistor 203 may be connected in series between the first signal IS1 line and the ground voltage VSS line, and gates of the PMOS transistor 201 and the NMOS transistor 203 may be connected to the inverted clock signal CKN line. The fourth signal IS1P may be output to a connection node 26 line between the PMOS transistor 201 and the NMOS transistor 203. The MN24 transistor may be connected between the second signal IS2 line and a node 320 line to which MN25 and MN26 transistors are connected in parallel, and a gate of the MN24 transistor may be connected to the fourth signal IS1P line. The MN25 and MN26 transistors may be connected between the node 320 line, to which the MN25 and MN26 transistors are connected in parallel, and the ground voltage VSS line, a gate of the MN25 transistor may be connected to the data input signal D line, and a gate of the MN26 transistor may be connected to the third signal IS2N line.

The third signal generation circuit 300 may include a PMOS transistor MP31 and an NMOS transistor MN31 connected between the power supply voltage VDD line and the ground voltage VSS line. Gates of the MP31 transistor and the MN31 transistor may be connected to the second signal IS2 line, and the third signal IS2N may be output to the third node 23 line between the MP31 transistor and the MN31 transistor.

The second signal IS2 line may be connected to the input terminal of the latch circuit 402 of the output circuit 400, and the latch circuit 402 may latch the inverted logic level of the logic level of the second signal IS2 in response to the logic high level of the clock signal CK, and may output the output signal Q to the fourth node 24 line connected to the output terminal. The inverter 404 may receive the output signal Q of the latch circuit 402 and output the inverted output signal QN to the fifth node 25 line.

Figure 4:
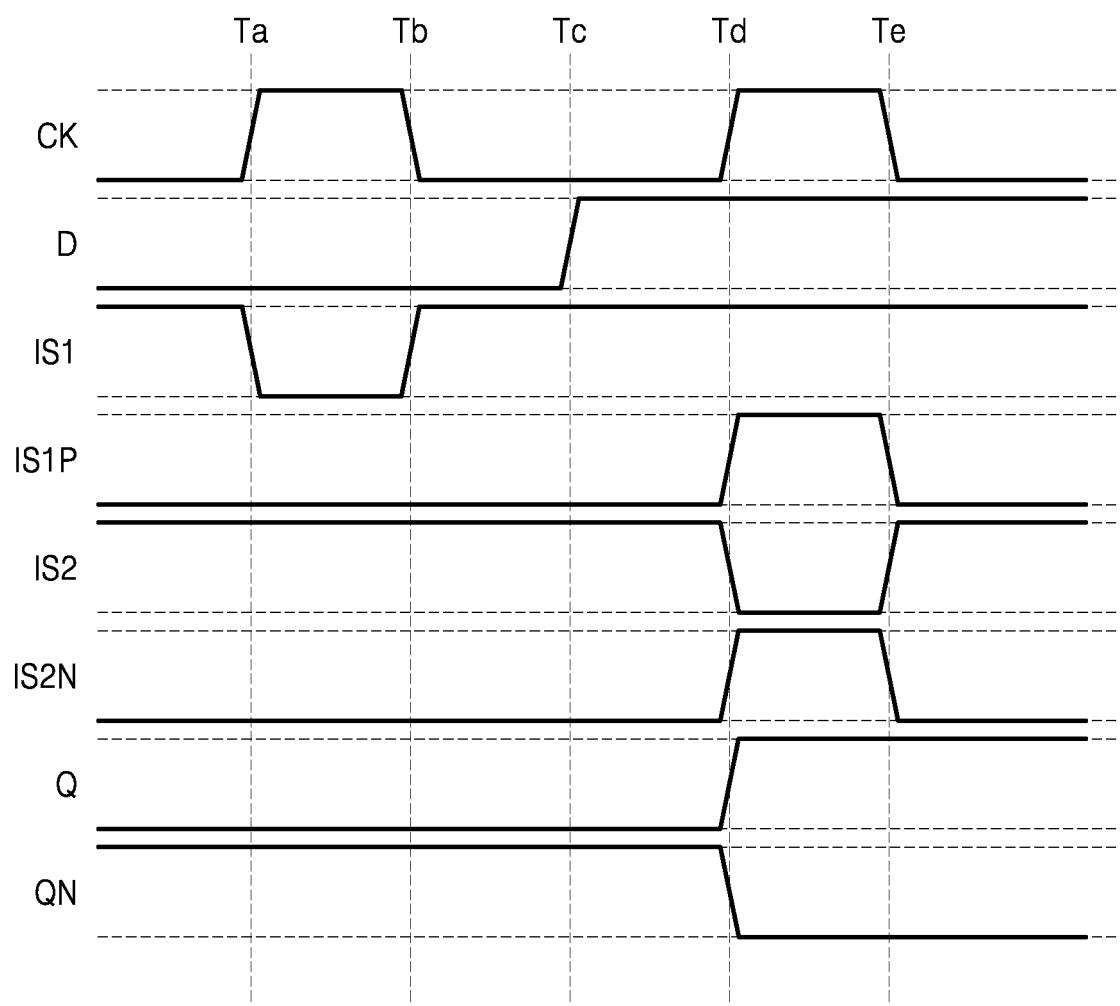
FIG. 4 is a timing diagram illustrating an operation of the flipflop circuit of FIGS. 2 and 3.

FIG. 4 is a timing diagram illustrating an operation of the flipflop circuit 10 of FIGS. 2 and 3. In FIG. 4, the flipflop circuit 10 may output the inverted output signal QN that is synchronized to the rising edge of the clock signal CK based on the data input signal D. It should be noted that the timing diagrams shown in FIG. 4 are not necessarily drawn to scale.

Referring to FIG. 4 in connection with FIG. 2, the clock signal CK may be received by the flipflop circuit 10. Before a time point Ta, the inverted clock signal CKN may be a logic high level according to a logic low level of the clock signal CK. In the first signal generation circuit 100, the output of the NOR gate 106 may become the logic low level by the logic high level of the inverted clock signal CKN, so that the first signal IS1 may become the logic high level. In the second signal generation circuit 200, the NMOS transistor 203 may be turned on by the logic high level of the inverted clock signal CKN, so that the fourth signal IS1P may become the logic low level. In the second signal generation circuit 200, the output of the first AND gate 202 may become the logic low level by the logic low level of the data input signal D, and the output of the second AND gate 206 may become the logic low level by the logic low level of the fourth signal IS1P, so that the second signal IS2 may become the logic high level. Accordingly, the third signal IS2N may become the logic low level.

At the time point Ta, the flipflop circuit 10 may output the output signal Q of the logic low level and the inverted output signal QN of the logic high level, based on the logic low level of the data input signal D synchronized with the rising edge of the clock signal CK. The inverted clock signal CKN may be transitioned to the logic low level according to the rising edge of the clock signal CK. In the first signal generation circuit 100, outputs of the OR gate 102 and the AND gate 104 may become the logic low level by the logic low level of the data input signal D and the third signal IS2N, the output of the NOR gate 106 may become the logic high level by the logic low level of the output of the AND gate 104 and the inverted clock signal CKN, so that the first signal IS1 may be transitioned from the logic high level to the logic low level. In the second signal generation circuit 200, the output of the first AND gate 202 may become the logic low level by the logic low level of the data input signal D, and the output of the second AND gate 206 may become the logic low level by the logic low level of the fourth signal IS1P of, so that the second signal IS2 may be maintained at the logic high level. In the third signal generation circuit 300, the third signal IS2N may also be maintained at the logic low level. The output circuit 400 may latch the second signal IS2 of the logic high level in response to the rising edge of the clock signal CK, thereby outputting the output signal Q of the logic low level and the inverted output signal QN of the logic high level.

At a time point Tb, the inverted clock signal CKN may be transitioned to the logic high level according to a falling edge of the clock signal CK. In the first signal generation circuit 100, the output of the NOR gate 106 may become the logic low level by the logic high level of the inverted clock signal CKN, so that the first signal IS1 may be transitioned from the logic low level to the logic high level. In the second signal generation circuit 200, the NMOS transistor 203 may be turned on by the logic high level of the inverted clock signal CKN, so that the fourth signal IS1P may be maintained at the logic low level. In the second signal generation circuit 200, the second signal IS2 may be maintained at the logic high level by the logic low level of the data input signal D and the fourth signal IS1P. In the third signal generation circuit 300, the third signal IS2N may also be maintained at the logic low level. The output circuit 400 may maintain the output signal Q of the logic low level and the inverted output signal QN of the logic high level.

At a time point Tc, the data input signal D may be transitioned from the logic low level to the logic high level.

At a time point Td, the output signal Q of the logic high level and the inverted output signal QN of the logic low level may be output, based on the logic high level of the data input signal D synchronized with the rising edge of the clock signal CK. The inverted clock signal CKN may be transitioned to the logic low level according to the rising edge of the clock signal CK. In the first signal generation circuit 100, the outputs of the OR gate 102 and the AND gate 104 may become the logic high level by the logic high level of the data input signal D and the first signal IS1, and the output of the NOR gate 106 may become the logic low level, so that the first signal IS1 may be maintained at the logic high level. In the second signal generation circuit 200, the output of the first AND gate 202 may become the logic high level by the logic high level of the first signal IS1, the clock signal CK, and the data input signal D, and the output of the NOR gate 208 may become the logic low level, so that the second signal IS2 may be transitioned from the logic high level to the logic low level. In the second signal generation circuit 200, the PMOS transistor 201 may be turned on by the logic low level of the inverted clock signal CKN, so that the fourth signal IS1P may be transitioned to the high level of the same logic level as the first signal IS1. In the third signal generation circuit 300, the logic low level of the second signal IS2 may be inverted, so that the third signal IS2N may be transitioned to the logic high level. The output circuit 400 may latch the second signal IS2 of the logic low level in response to the rising edge of the clock signal CK, thereby outputting the output signal Q of the logic high level and the inverted output signal QN of the logic low level.

At a time point Te, the inverted clock signal CKN may be transitioned to the logic high level according to the falling edge of the clock signal CK. In the first signal generation circuit 100, the output of the NOR gate 106 may become the logic low level by the logic high level of the inverted clock signal CKN, so that the first signal IS1 may be maintained at the logic high level. In the second signal generation circuit 200, the NMOS transistor 203 may be turned on by the logic high level of the inverted clock signal CKN, so that the fourth signal IS1P may be transitioned from the logic high level to the logic low level. In the second signal generation circuit 200, the output of the NOR gate 208 may become the logic high level by the logic low level of the clock signal CK and the fourth signal IS1P, so that the second signal IS2 may be transitioned from the logic low level to the logic high level. In the third signal generation circuit 300, the logic high level of the second signal IS2 may be inverted, so that the third signal IS2N may be transitioned to the logic low level. The output circuit 400 may maintain the output signal Q of the logic high level and the inverted output signal QN of the logic low level.

Referring to FIG. 4 in connection with FIG. 3, the clock signal CK may be received by the flipflop circuit 10.

Before the time point Ta, the inverted clock signal CKN may become the logic high level according to the logic low level of the clock signal CK. In the first signal generation circuit 100, the MN11 transistor may be turned on by the logic high level of the inverted clock signal CKN, so that the data node 310 line may become the logic low level, and the first signal IS1 may become the logic high level. In the second signal generation circuit 200, the NMOS transistor 203 may be turned on by the logic high level of the inverted clock signal CKN, so that the fourth signal IS1P may become the logic low level. In the second signal generation circuit 200, the MP22 transistor may be turned on by the logic low level of the clock signal CK, so that the second signal IS2 may become the logic high level. In the third signal generation circuit 300, the logic high level of the second signal IS2 may be inverted, so that the third signal IS2N may become the logic low level.

At the time point Ta, the logic low level of the output signal Q and the logic high level of the inverted output signal QN may be output, based on the logic low level of the data input signal D synchronized with the rising edge of the clock signal CK. The inverted clock signal CKN may be transitioned to the logic low level according to the rising edge of the clock signal CK. In the first signal generation circuit 100, the MP11, MP12, and MP13 transistors may be turned on by the logic low level of the inverted clock signal CKN, the data input signal D, and the third signal IS2N, so that the data node 310 line may become the logic high level and the first signal IS1 may transition from the logic high level to the logic low level. In the second signal generation circuit 200, the MP21 transistor may be turned on by the logic low level of the first signal IS1, so that the second signal IS2 may be maintained at the logic high level. In the third signal generation circuit 300, the third signal IS2N may also be maintained at the logic low level. The output circuit 400 may latch the second signal IS2 of the logic high level in response to the rising edge of the clock signal CK, thereby outputting the output signal Q of the logic low level and the inverted output signal QN of the logic high level.

At the time point Tb, the inverted clock signal CKN may be transitioned to the logic high level according to the falling edge of the clock signal CK. In the first signal generation circuit 100, the MN11 transistor may be turned on by the logic high level of the inverted clock signal CKN, so that the data node 310 line may become the logic low level and the first signal IS1 may be transitioned from the logic low level to the logic high level. In the second signal generation circuit 200, the NMOS transistor 203 may be turned on by the logic high level of the inverted clock signal CKN, so that the fourth signal IS1P may be maintained at the logic low level. In the second signal generation circuit 200, the MP22 transistor may be turned on by the logic low level of the clock signal CK, so that the second signal IS2 may be maintained at the logic high level. In the third signal generation circuit 300, the third signal IS2N may also be maintained at the logic low level. The output circuit 400 may maintain the output signal Q of the logic low level and the inverted output signal QN of the logic high level.

At the time point Tc, the data input signal D may be transitioned from the logic low level to the logic high level.

At the time point Td, the output signal Q of the logic high level and the inverted output signal QN of the logic low level may be output, based on the logic high level of the data input signal D synchronized with the rising edge of the clock signal CK. The inverted clock signal CKN may be transitioned to the logic low level according to the rising edge of the clock signal CK. In the first signal generation circuit 100, the MN12 and MN13 transistors may be turned on by the logic high level of the third signal IS2N and the first signal IS1, so that the data node 310 line may become the logic low level, and the first signal IS1 may be maintained at the logic high level. In the second signal generation circuit 200, the MN21, MN22, and MN23 transistors may be turned on by the logic high level of the data input signal D, the first signal IS1, and the clock signal CK, so that the second signal IS2 may be transitioned from the logic high level to the logic low level. In the second signal generation circuit 200, the PMOS transistor 201 may be turned on by the logic low level of the inverted clock signal CKN, so that the fourth signal IS1P may be transitioned to the logic high level of the same logic level as the first signal IS1. In the second signal generation circuit 200, the MN24 and MN25 transistors may be turned on by the logic high level of the fourth signal IS1P and the data input signal D, so that the second signal IS2 may be transitioned to the logic low level. In the third signal generation circuit 300, the logic low level of the second signal IS2 may be inverted, so that the third signal IS2N may be transitioned to the logic high level. The output circuit 400 may latch the second signal IS2 of the logic low level in response to the rising edge of the clock signal CK, thereby outputting the output signal Q of the logic high level and the inverted output signal QN of the logic low level.

Here, the second signal IS2 line may be discharged to a level of the ground voltage VSS through the first current path I1 including the MN21, MN22, and MN23 transistors and the second current path I2 including MN24 and MN25 transistors. The two first and second current paths I1 and I2 for discharge may be configured to affect the second signal IS2 line, which may prevent a hold time of the flipflop circuit 10 from becoming large.

At the time point Te, the inverted clock signal CKN may be transitioned to the logic high level according to the falling edge of the clock signal CK. In the first signal generation circuit 100, the MN11 transistor may be turned on by the logic high level of the inverted clock signal CKN, so that the data node 310 line may become the logic low level, and the first signal IS1 may be maintained at the logic high level. In the second signal generation circuit 200, the NMOS transistor 203 may be turned on by the logic high level of the inverted clock signal CKN, so that the fourth signal IS1P may be transitioned from the logic high level to the logic low level. In the second signal generation circuit 200, the MP22 transistor may be turned on by the logic low level of the clock signal CK, so that the second signal IS2 may be transitioned from the logic low level to the logic high level. In the third signal generation circuit 300, the logic high level of the second signal IS2 may be inverted, so that the third signal IS2N may be transitioned to the logic low level. The output circuit 400 may maintain the output signal Q of the logic high level and the inverted output signal QN of the logic low level.

In the flipflop circuit 10 of FIGS. 2, 3 and 4, logic levels of the first signal IS1 or the second signal IS2 may be determined when the clock signal CK is changed to the rising edge, and it may be seen that the signals IS1 and the second signals IS2 may be generated while affecting each other. And, it may be seen that while the clock signal CK may be at the logic high level, the logic levels of the first signal IS1 and the second signal IS2 may be maintained to output the output signal Q and the inverted output signal QN. That is, in the flipflop circuit 10, even when the clock signal CK may be changed to the rising edge in the process of the first signal IS1 and the second signal IS2 affecting each other, a glitch may not be generated in the output signal Q and the inverted output signal QN. This means that even when the clock signal CK may be changed to the rising edge, the logic level of the data input signal D may be changed. The fact that the logic level of the data input signal D may be changed even when the clock signal CK may be changed to the rising edge means that the flipflop circuit 10 may have a negative set-up time. In addition, in the flipflop circuit 10, a delay time in a signal path in which the clock signal CK may be transmitted to the first signal IS1 line and the second signal IS2 line may also be beneficial in having the negative set-up time.

As described above, the flipflop circuit 10 may have the negative set-up time and prevent the hold time from being increased, so that a high-speed operation with a fast data to output (D-to-Q) time may be performed.

FIGS. 5 to 10 are diagrams illustrating modified examples of the flipflop circuit 10 of FIG. 3. Compared to the flipflop circuit 10 of FIG. 3, the flipflop circuits 10 of FIGS. 5 to 10 may be different in configurations of a first signal generation circuit 100_10, second signal generation circuits 200_5, 200_6, 200_7, 200_8, and 200_9, and an output circuit 400_10. For convenience of description, descriptions of configurations that are substantially the same as that described above with reference to FIG. 3 will be omitted.

Figure 5:
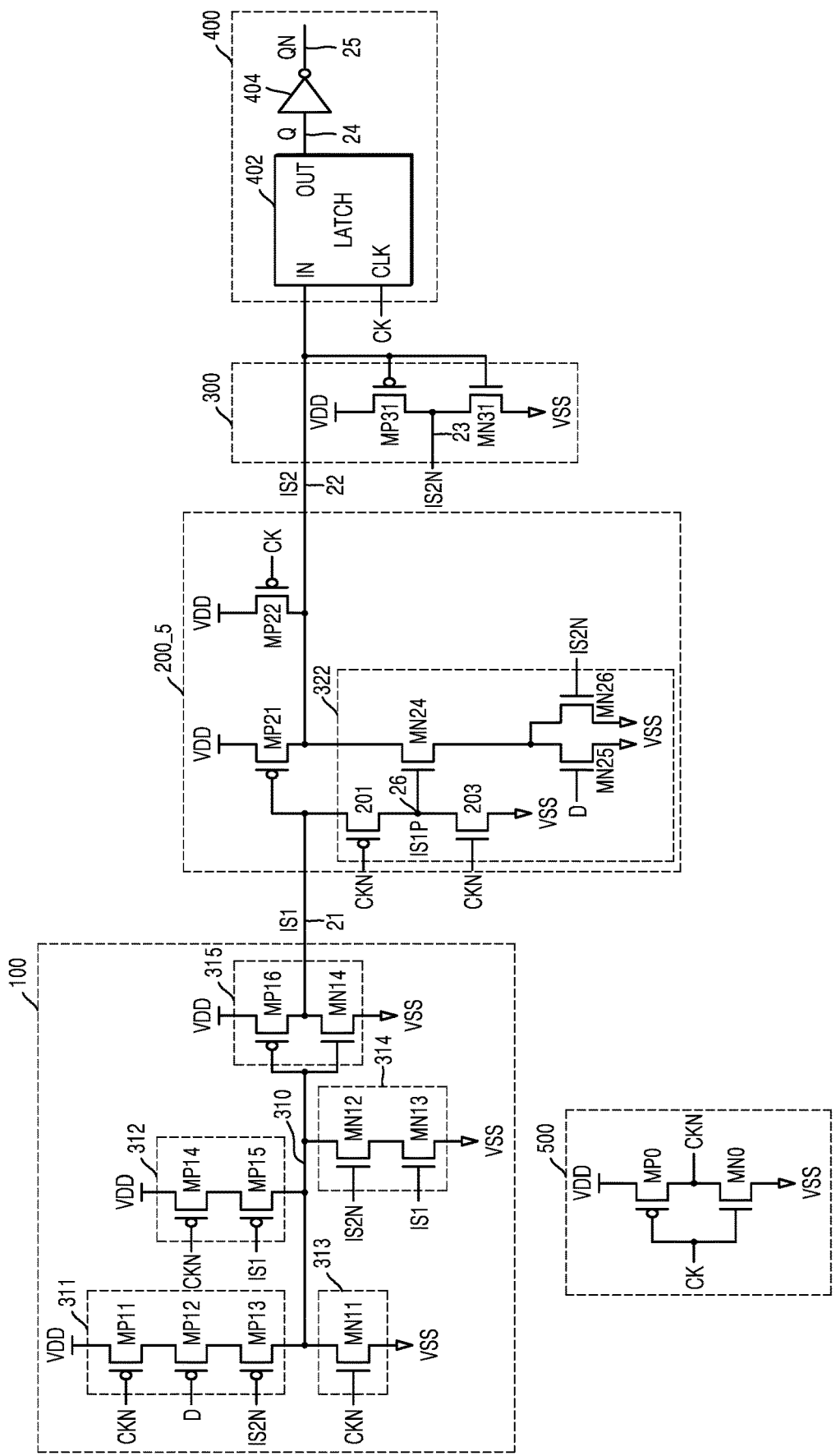
FIGS. 5 to 10 are diagrams illustrating modified examples of the flipflop circuit of FIG. 3.

Referring to FIG. 5, the second signal generation circuit 200_5 may not include the transistors MN21, MN22, and MN23 of the first stack 321 connected between the second signal IS2 line and the ground voltage VSS line, illustrated in FIG. 3.

Figure 6:
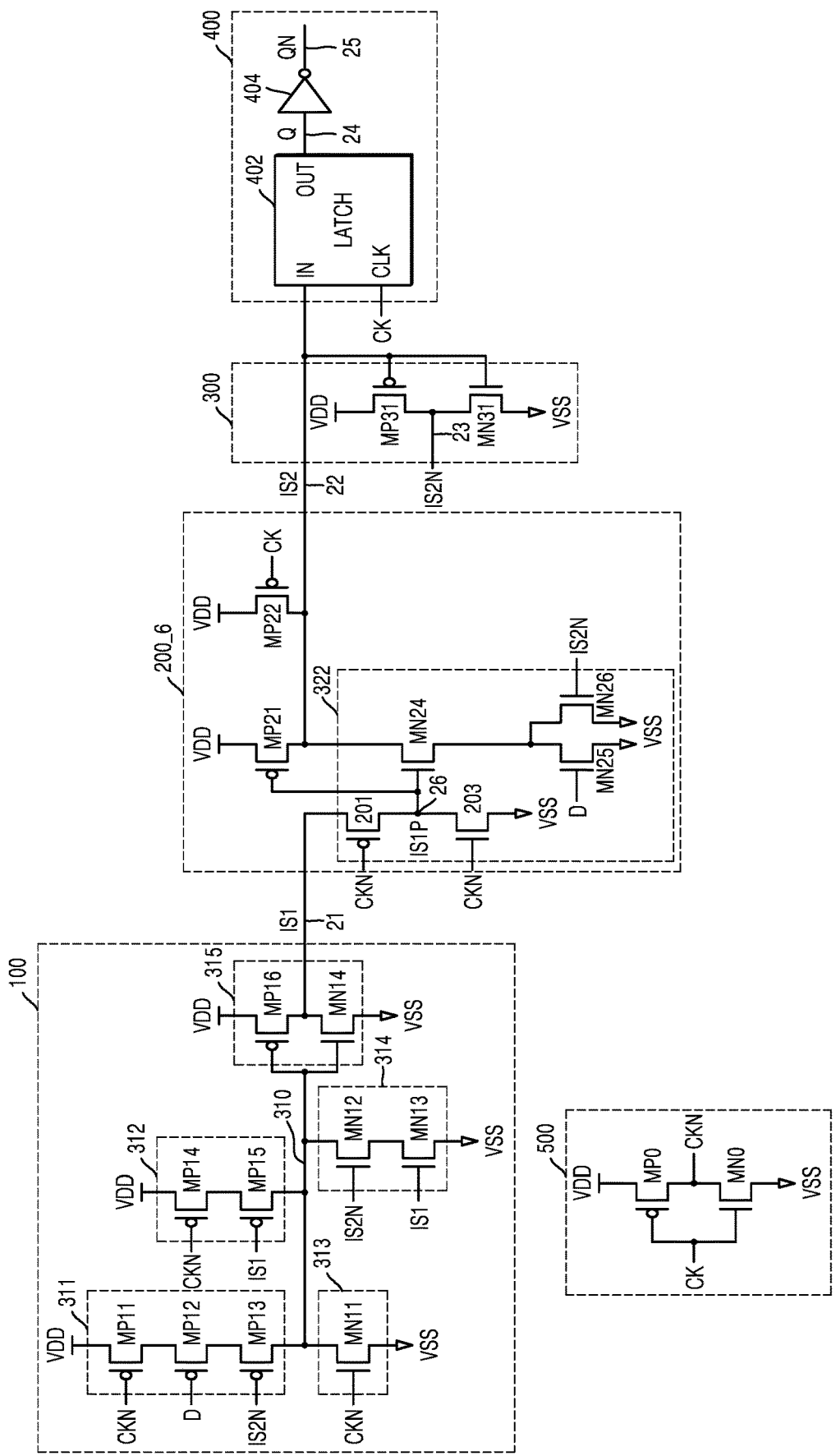

Referring to FIG. 6, the second signal generation circuit 200_6 may not include the transistors MN21, MN22, and MN23 of the first stack 321 connected between the second signal IS2 line and the ground voltage VSS line, illustrated in FIG. 3. In addition, the gate of the MP21 transistor may be connected to the fourth signal IS1P line, not the first signal IS1 line.

Figure 7:
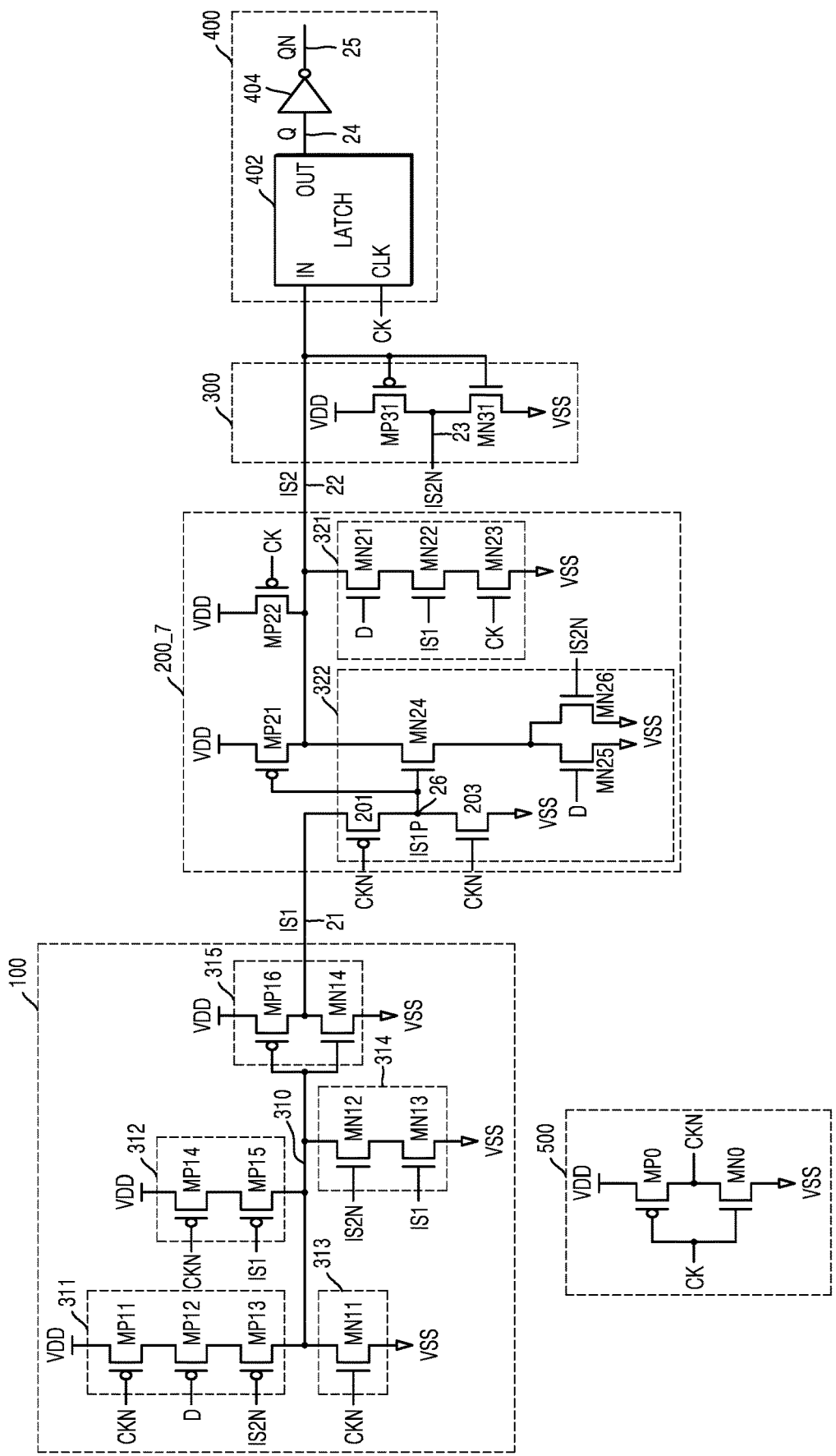

Referring to FIG. 7, in the second signal generation circuit 200_7, the gate of the MP21 transistor may be connected to the fourth signal IS1P line, not the first signal IS1 line, illustrated in FIG. 3.

Figure 8:
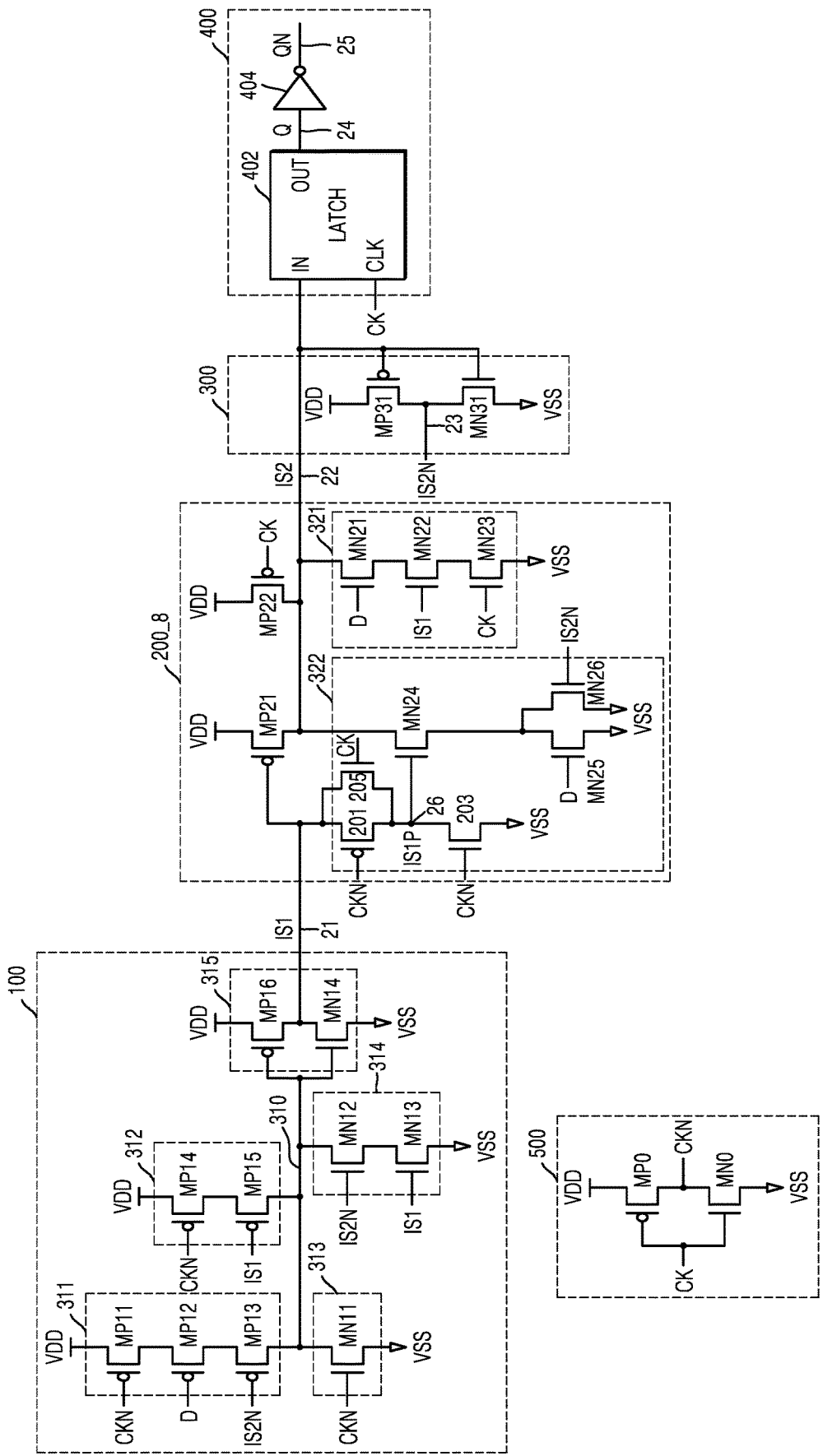

Referring to FIG. 8, the second signal generation circuit 200_8 may further include an NMOS transistor 205 connected in parallel to the PMOS transistor 201 illustrated in FIG. 3. The NMOS transistor 205 may be connected between the first signal IS1 line and the fourth signal IS1P line, and a gate thereof may be connected to the clock signal CK line.

Figure 9:
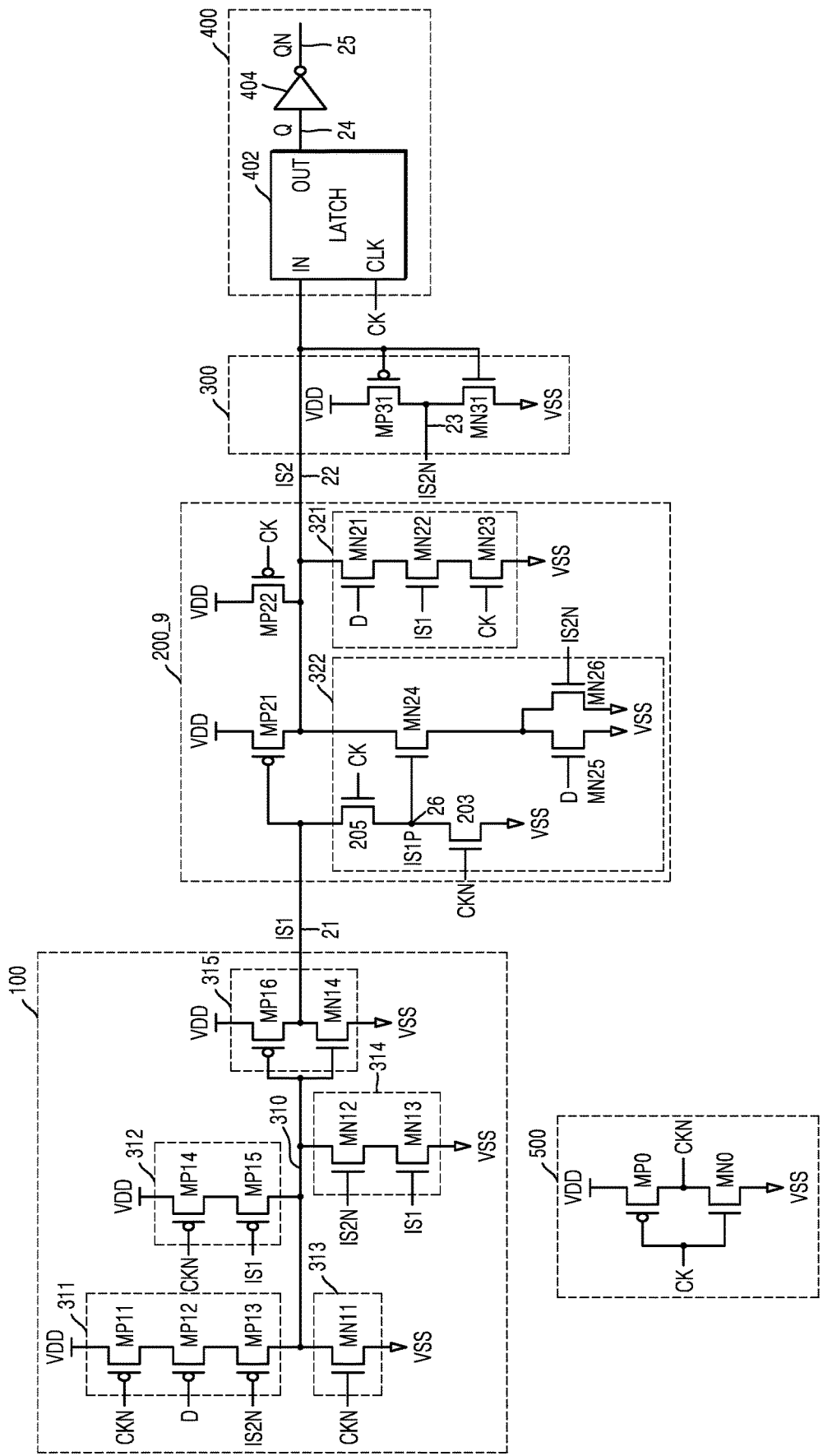

Referring to FIG. 9, the second signal generation circuit 200_9 may include the NMOS transistor 205 instead of the PMOS transistor 201 illustrated in FIG. 3. The NMOS transistor 205 may be connected between the first signal IS1 line and the fourth signal IS1P line, and a gate thereof may be connected to the clock signal CK line.

Figure 10:
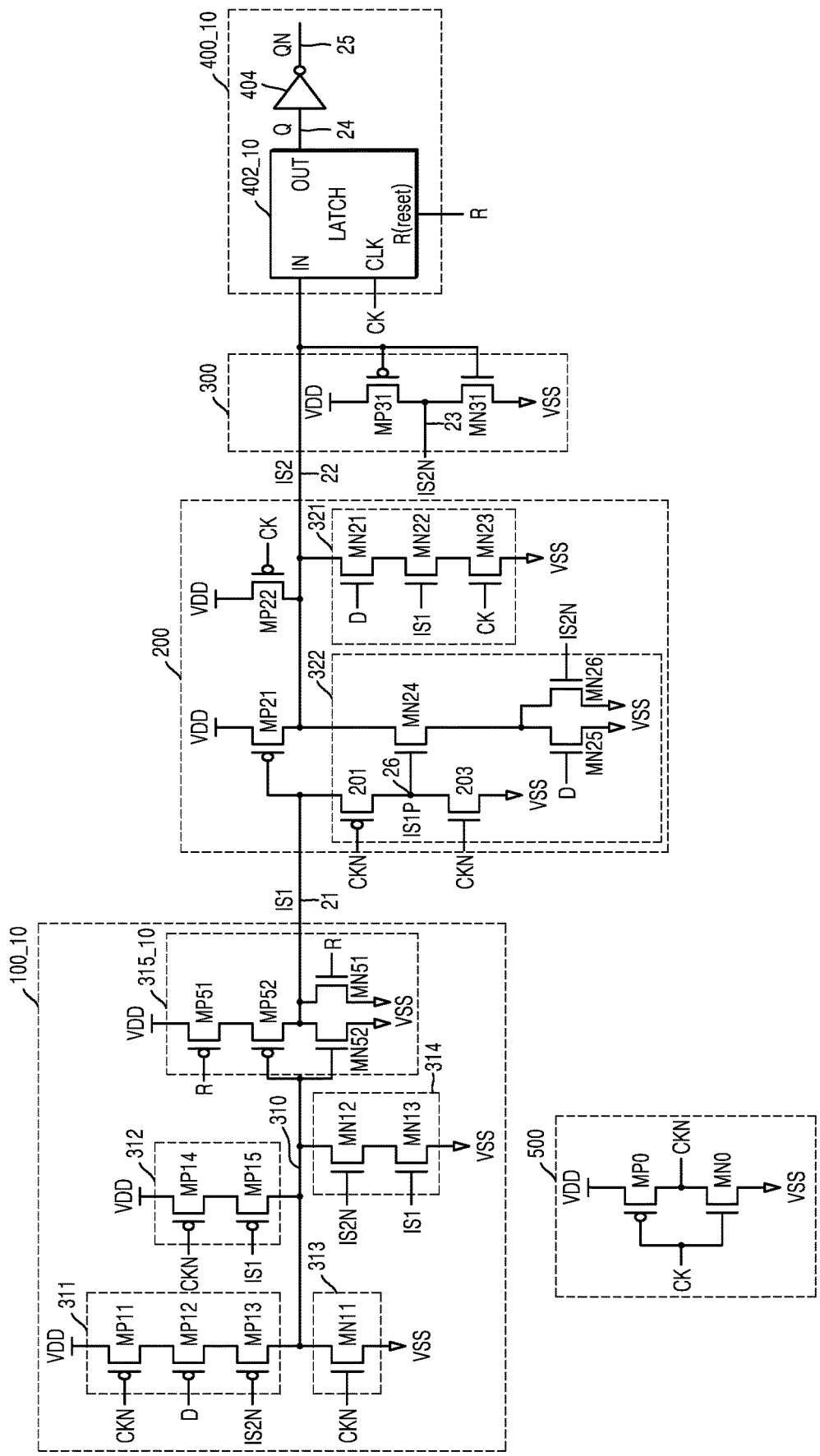

Referring to FIG. 10, the flipflop circuit 10 may reset the first signal IS1 and the output signal Q to the logic low level in response to a reset signal R. The first signal generation circuit 100_10 may include a NOR gate circuit 315_10 that receives the reset signal R and a data node 310 signal instead of the inverter 315 of FIG. 3. The NOR gate circuit 315_10 may include PMOS transistors MP51 and MP52 connected in series between the power supply voltage VDD line and the first signal IS1 line and NMOS transistors MN51 and MN52 connected in parallel between the first signal IS1 line and the ground voltage VSS line. Gates of the MP51 transistor and the MN51 transistor may be connected to the reset signal R line, and gates of the MP52 transistor and the MN52 transistor may be connected to the data node 310 line. A connection node between the MP52 transistor and the MN51 and MN52 transistors may be connected to the first node 21 line, and the first signal IS1 may be output to the first node 21 line. The NOR gate circuit 315_10 may reset the first signal IS1 to the logic low level in response to the logic high level of the reset signal R.

In the output circuit 400_10, a latch circuit 402_10 may further include a reset terminal for receiving the reset signal R. The latch circuit 402_10 may reset the output signal Q to the logic low level in response to the logic high level of the reset signal R. Accordingly, the inverted output signal QN may be output at the logic high level.

Figure 11:
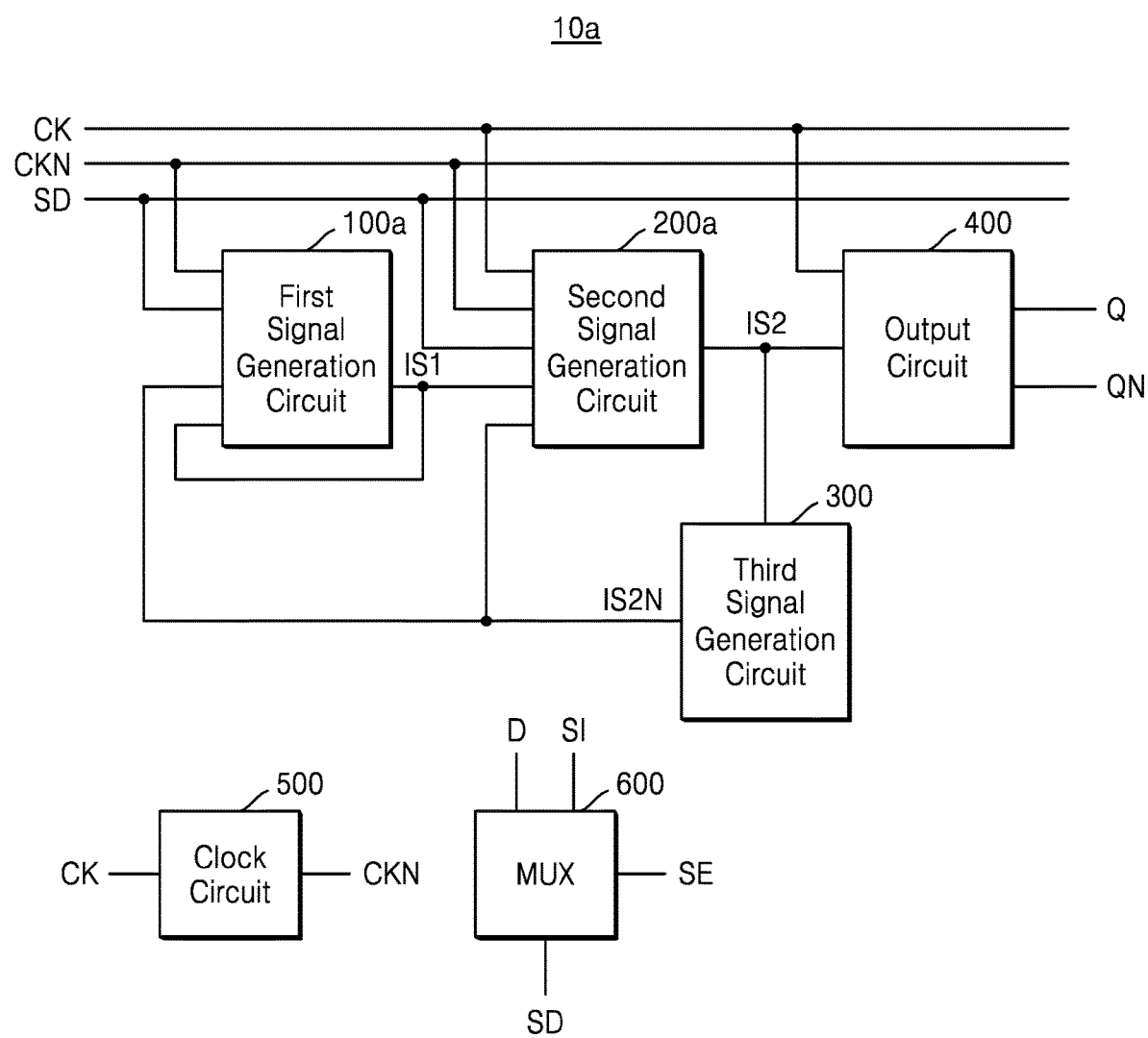
FIGS. 11 and 12 are diagrams of a second example illustrating a flipflop circuit according to an embodiment.
Figure 12:
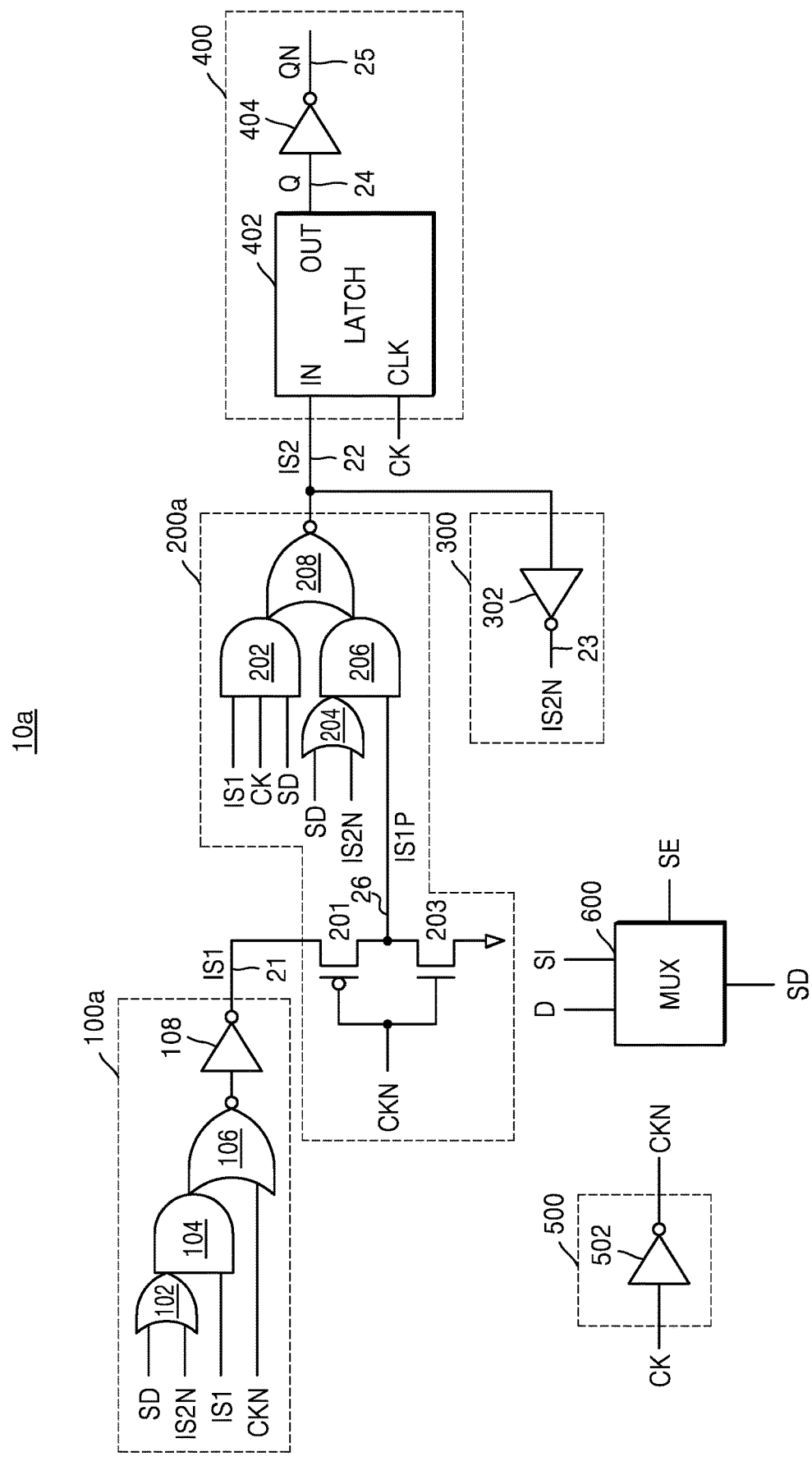

FIGS. 11 and 12 are diagrams of a second example illustrating a flipflop circuit according to an embodiment. FIG. 12 illustrates a logic diagram of a flipflop circuit 10a of FIG. 11.

Referring to FIGS. 11 and 12, the flipflop circuit 10a may operate in one of a normal operation mode and a scan test mode. The flipflop circuit 10a may output the output signal Q and the inverted output signal QN based on the data input signal D in the normal operation mode, and may output the output signal Q and the inverted output signal QN based on a scan input signal SI in the scan test mode. The flipflop circuit 10a may include a first signal generation circuit 100a, a second signal generation circuit 200a, the third signal generation circuit 300, the output circuit 400, the clock circuit 500, and a multiplexer 600.

The multiplexer 600 may select one of the data input signal D and the scan input signal SI in response to the logic level of a scan enable signal SE, and may output a selected signal as a multiplexer output signal SD. The multiplexer 600 may output the data input signal D as the multiplexer output signal SD in response to the scan enable signal SE of the logic low level, and may output the scan input signal SI as the multiplexer output signal SD in response to the scan enable signal SE of the logic high level.

In the flipflop circuit 10a, the first signal generation circuit 100a may receive the inverted clock signal CKN, the multiplexer output signal SD, the first signal IS1, and the third signal IS2N, and generate the first signal IS1. The second signal generation circuit 200a may receive the clock signal CK, the inverted clock signal CKN, the multiplexer output signal SD, the first signal IS1, and the third signal IS2N, and generate the second signal IS2. The third signal generation circuit 300 may receive the second signal IS2 and generate the third signal IS2N. The third signal generation circuit 300 may provide an inverted second signal as the third signal IS2N. The output circuit 400 may receive the clock signal CK and the second signal IS2 and output the output signal Q and the inverted output signal QN.

Compared to the flipflop circuit 10 of FIGS. 1 and 2, the flipflop circuit 10a of FIGS. 11 and 12 is different in that the multiplexer output signal SD may be connected to the first and second signal generation circuits 100a and 200a instead of the data input signal D. Hereinafter, descriptions of the flipflop circuit 10a that overlap those of FIGS. 1 and 2 will be omitted.

The flipflop circuit 10a may output the inverted output signal QN synchronized to the rising edge of the clock signal CK based on the data input signal D, when the multiplexer output signal SD is the data input signal D in response to the scan enable signal SE of the logic low level. The flipflop circuit 10a may output the inverted output signal QN synchronized to the rising edge of the clock signal CK based on the scan input signal SI, when the multiplexer output signal SD is the scan input signal SD in response to the scan enable signal SE of the logic high level.

Figure 13:
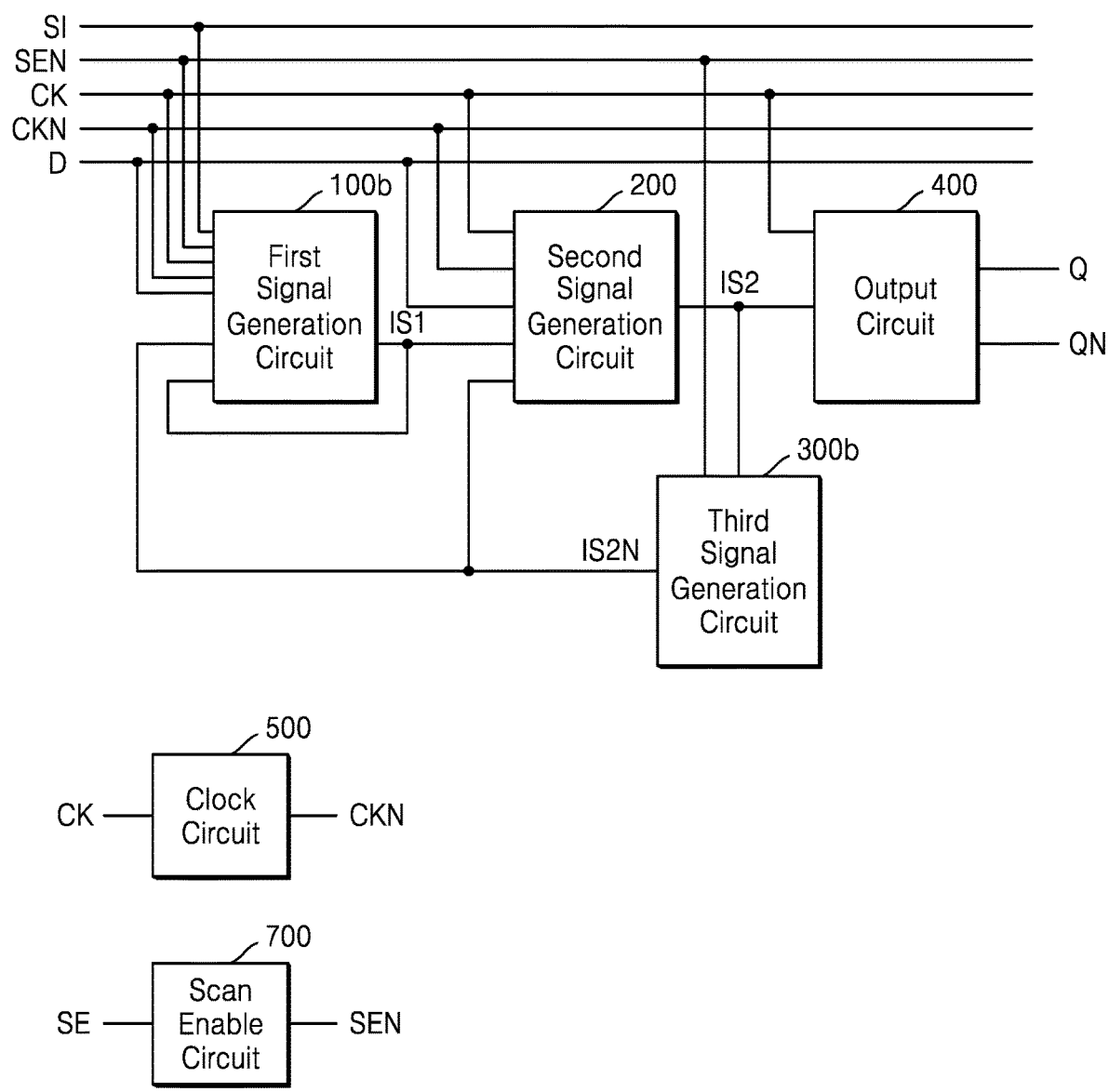
FIGS. 13 to 16 are diagrams of a third example illustrating a flipflop circuit according to an embodiment.
Figure 14:
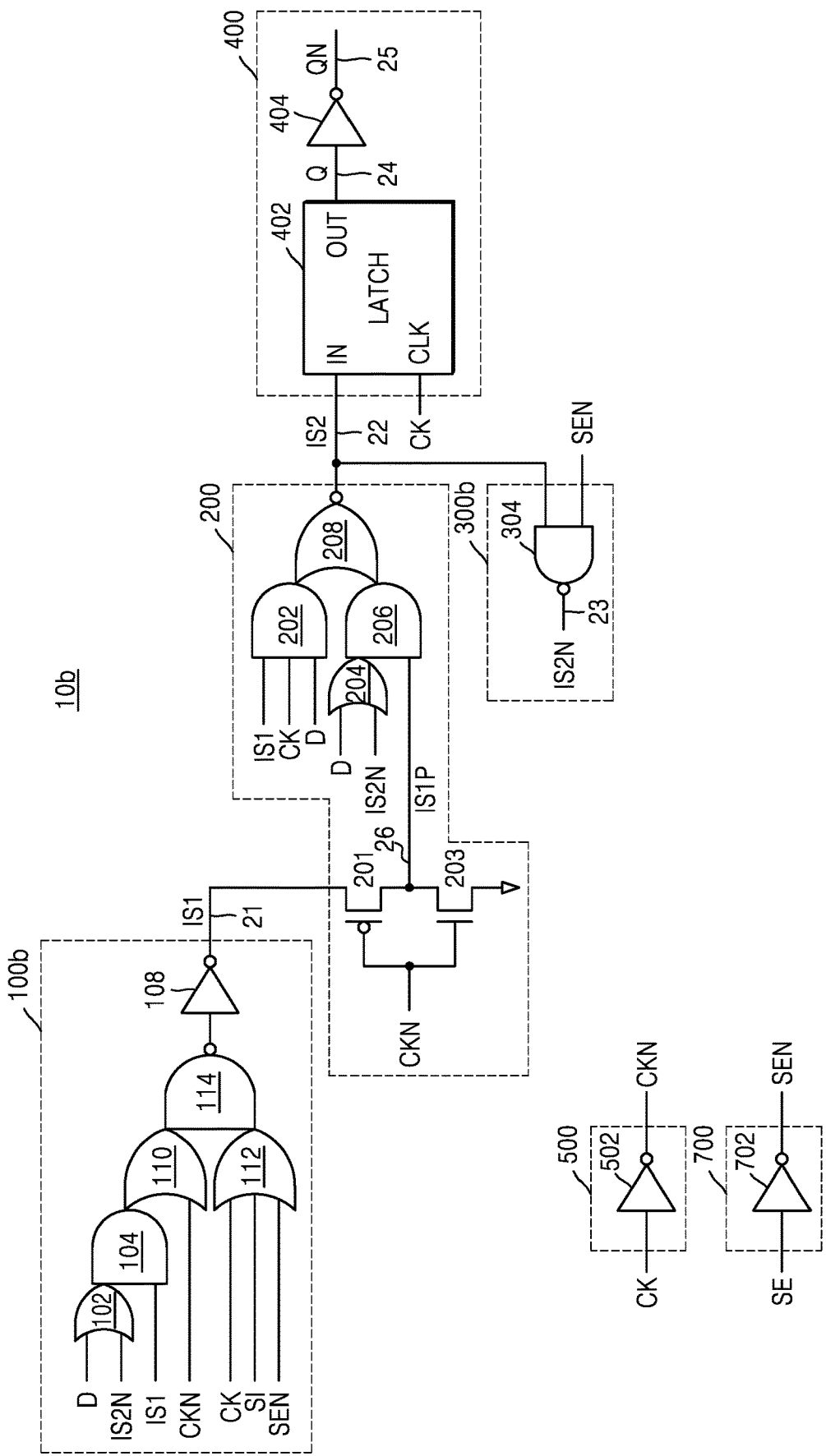
Figure 15:
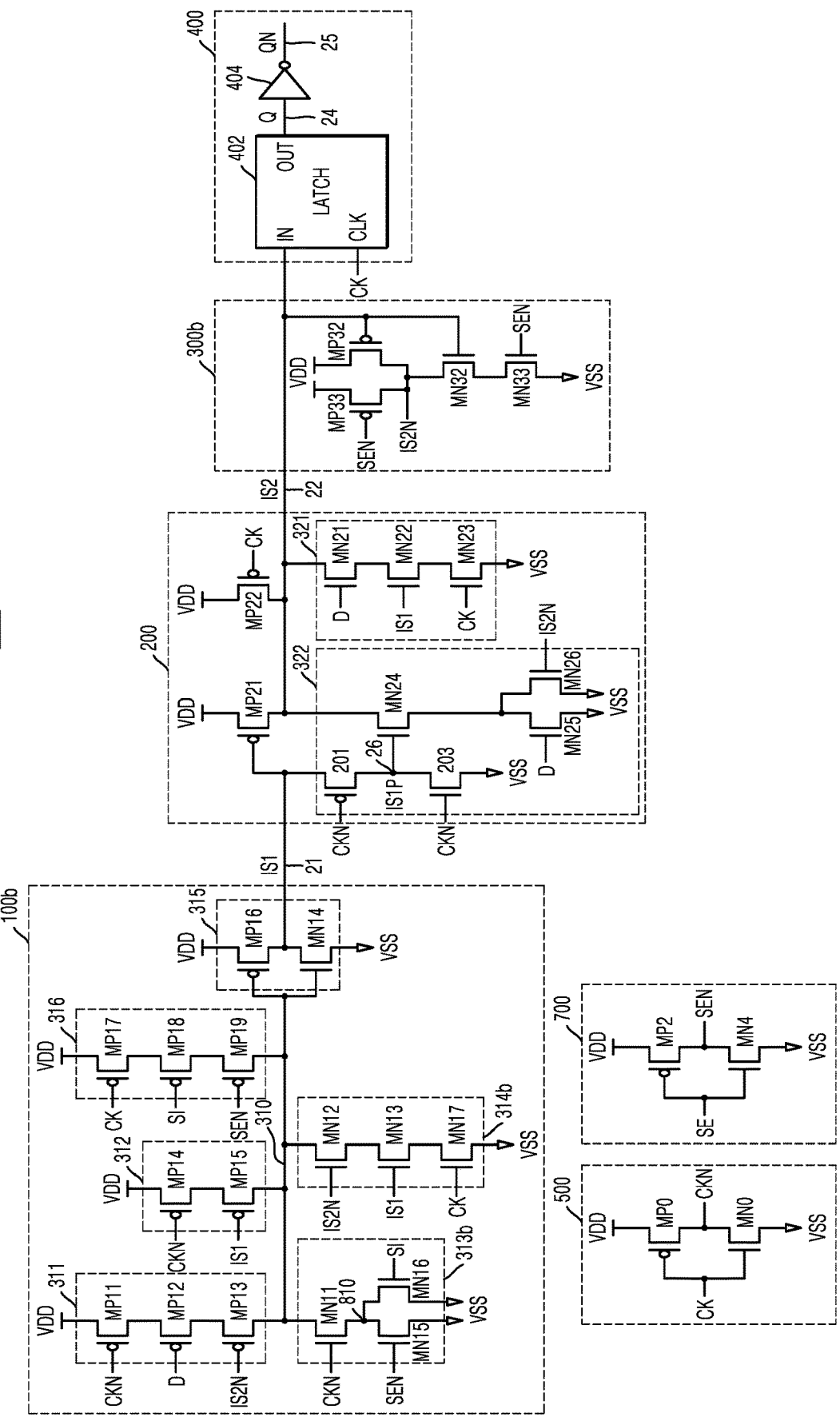
Figure 16:
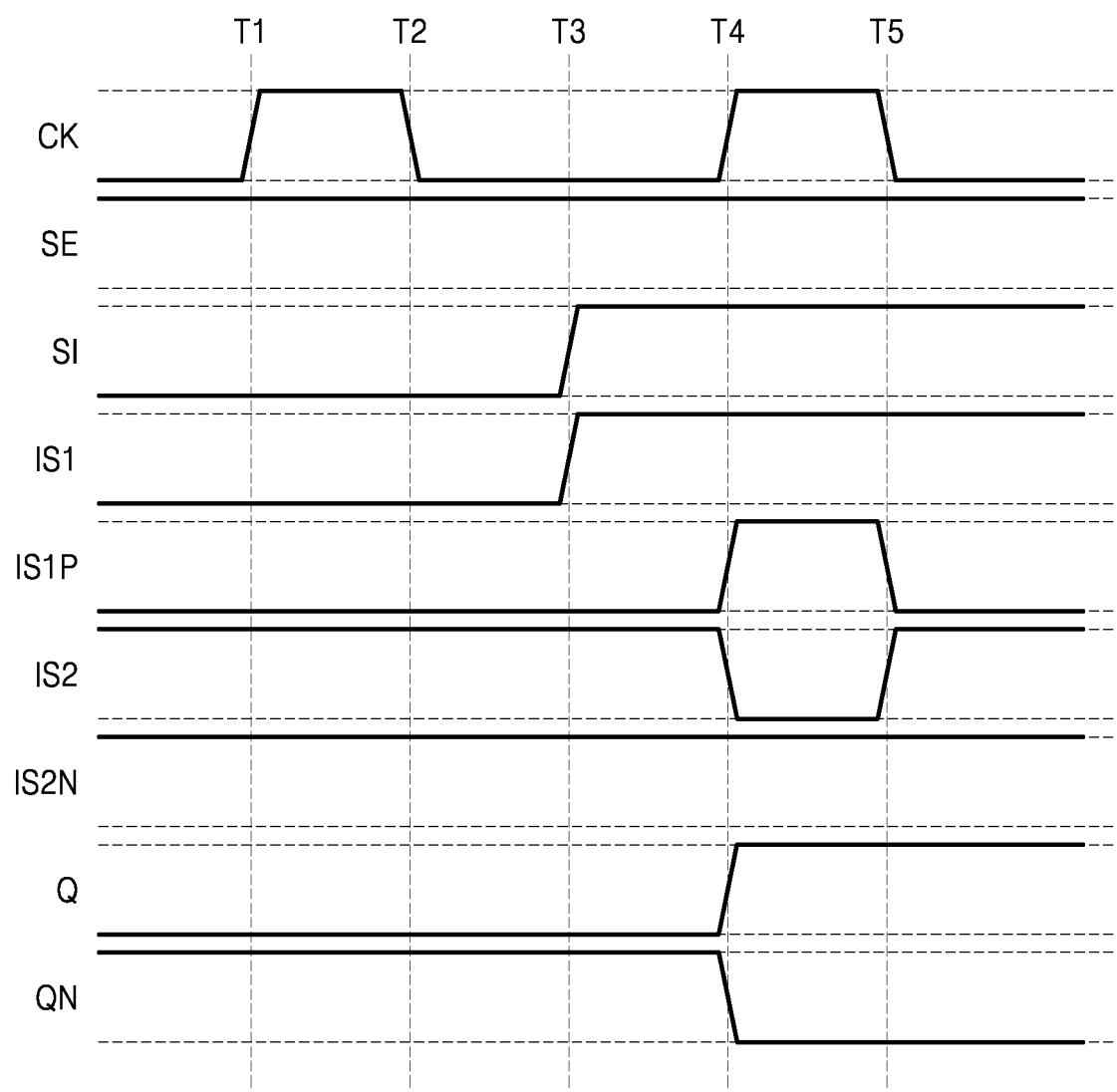

FIGS. 13 to 16 are diagrams of a third example illustrating a flipflop circuit according to an embodiment. FIG. 14 is a logic diagram of a flipflop circuit 10b of FIG. 13, FIG. 15 is a circuit diagram of the flipflop circuit 10b of FIG. 13, and FIG. 16 is an operation timing diagram of the flipflop circuit 10b of FIG. 13.

Referring to FIG. 13, the flipflop circuit 10b may operate in one of the normal operation mode and the scan test mode. The flipflop circuit 10b may output the output signal Q and the inverted output signal QN based on the data input signal D in the normal operation mode, and may output the output signal Q and the inverted output signal QN based on the scan input signal SI in the scan test mode. The flipflop circuit 10b may include a first signal generation circuit 100b, the second signal generation circuit 200, a third signal generation circuit 300b, the output circuit 400, the clock circuit 500, and a scan enable circuit 700.

The clock circuit 500 may receive the clock signal CK and output the inverted clock signal CKN. The scan enable circuit 700 may receive the scan enable signal SE and output an inverted scan enable signal SEN.

The first signal generation circuit 100b may receive the scan input signal SI, the inverted scan enable signal SEN, the clock signal CK, the inverted clock signal CKN, the data input signal D, the first signal IS1, and the third signal IS2N, and generate the first signal IS1. The second signal generation circuit 200 may receive the clock signal CK, the inverted clock signal CKN, the data input signal D, the first signal IS1, and the third signal IS2N, and generate the second signal IS2. The second signal generation circuit 200 may be configured to discharge a second signal IS2 line to which the second signal IS2 may be output, by using a fourth signal IS1P derived from the first signal IS1. The third signal generation circuit 300b may receive the inverted scan enable signal SEN and the second signal IS2, and generate the third signal IS2N. The output circuit 400 may receive the clock signal CK and the second signal IS2 and output the output signal Q and the inverted output signal QN.

Referring to FIG. 14, the clock circuit 500 may be configured with the inverter 502 that may receive the clock signal CK and output the inverted clock signal CKN. An input of the inverter 502 may be connected to the clock signal CK line, and the output of the inverter 502 may be connected to the inverted clock signal CKN line. The scan enable circuit 700 may be configured with an inverter 702 that may receive the scan enable signal SE and output the inverted scan enable signal SEN. An input of the inverter 702 may be connected to the scan enable signal SE line, and the output of the inverter 702 may be connected to the inverted scan enable signal SEN line.

The first signal generation circuit 100b may connect to the data input signal D line, the third signal IS2N line, the first signal IS1 line, the inverted clock signal CKN line, the clock signal CK line, the scan input signal SI, the inverted scan enable signal SEN, and the first signal IS1 line, and may include a complex gate including a first OR gate 102, an AND gate 104, a second OR gate 110, a third OR gate 112, a NAND gate 114, and the inverter 108.

The first OR gate 102 may include a first input that receives the data input signal D, a second input that receives the third signal IS2N, and an output. The AND gate 104 may include a first input that receives the output of the first OR gate 102, a second input that receives the first signal IS1, and an output. The second OR gate 110 may include a first input that receives the output of the AND gate 104, a second input that receives the inverted clock signal CKN, and an output. The third OR gate 112 may include a first input that receives the clock signal CK, a second input that receives the scan input signal SI, a third input that receives the inverted scan enable signal SEN, and an output. The NAND gate 114 may include a first input that receives the output of the second OR gate 110, a second input that receives the output of the third OR gate 112, and an output. The inverter 108 may include an input that receives the output of the NAND gate 114, and an output that generates the first signal IS1. The output of the inverter 108 may be output to the first signal IS1 line.

The second signal generation circuit 200 may be configured in the same manner as the second signal generation circuit 200 of FIG. 2. In the second signal generation circuit 200, the first AND gate 202 may include a first input that receives the first signal IS1, a second input that receives the clock signal CK, a third input that receives the data input signal D, and an output. The OR gate 204 may include a first input that receives the data input signal D, a second input that receives the third signal IS2N, and an output. The PMOS transistor 201 and the NMOS transistor 203 may be connected in series between the first signal IS1 line and the ground voltage VSS line, and gates of the PMOS transistor 201 and the NMOS transistor 203 may be connected to the inverted clock signal CKN line. The fourth signal IS1P may be output to the connection node 26 line between the PMOS transistor 201 and the NMOS transistor 203. The second AND gate 206 may include a first input that receives the output of the OR gate 204, a second input that receives the fourth signal IS1P, and an output. The NOR gate 208 may include a first input that receives the output of the first AND gate 202, a second input that receives the output of the second AND gate 206, and an output. The output of the NOR gate 208 may be output to the second signal IS2 line.

The third signal generation circuit 300b may include a NAND gate 304 that is connected to the second signal IS2 line, the inverted scan enable signal SEN line, and the third signal IS2N line. The NAND gate 304 may include a first input receiving the second signal IS2, a second input receiving the inverted scan enable signal SEN, and an output. The output of the NAND gate 304 may be output to the third signal IS2N line.

The output circuit 400 may be configured in the same manner as the output circuit 400 of FIG. 2. In the output circuit 400, the latch circuit 402 may latch the inverted logic level of the logic level of the second signal IS2 in response to the rising edge of the clock signal CK, and may output the output signal Q to the fourth node 24 line connected to the output terminal. The inverter 404 may receive the output signal Q and output the inverted output signal QN.

Referring to FIG. 15, the clock circuit 500 may include a PMOS transistor MPO and an NMOS transistor MNO connected between a power supply voltage VDD line and a ground voltage VSS line. Gates of the PMOS transistor MPO and the NMOS transistor MNO may be connected to the clock signal CK line, and the connection node between the PMOS transistor MPO and the NMOS transistor MNO may be connected to the inverted clock signal CKN line. The scan enable circuit 700 may include a PMOS transistor MP2 and an NMOS transistor MN4 connected between the power supply voltage VDD and the ground voltage VSS. Gates of the PMOS transistor MP2 and the NMOS transistor MN4 may be connected to the scan enable signal SE line, and a connection node between the PMOS transistor MP2 and the NMOS transistor MN4 may be connected to the inverted scan enable signal SEN line.

The first signal generation circuit 100b may include a plurality of stacks of transistors, for example, first, second, third, fourth, and fifth stacks 311, 312, 313b, 314b, and 316 of transistors, which are respectively connected to the power supply voltage VDD line and the ground voltage VSS line, and the first, second, third, fourth, and fifth stacks 311, 312, 313b, 314b, and 316 of transistors may be commonly connected to the data node 310 line. In addition, the first signal generation circuit 100b may include the inverter 315 connected between the data node 310 line and the first node 21 line.

The transistors of the first stack 311 may include PMOS transistors MP11, MP12, and MP13 connected in series between the power supply voltage VDD line and the data node 310 line. The gate of the MP11 transistor may be connected to the inverted clock signal CKN line, the gate of the MP12 transistor may be connected to the data input signal D line, and the gate of the MP13 transistor may be connected to the third signal IS2N line.

The transistors of the second stack 312 may include PMOS transistors MP14 and MP15 connected in series between the power supply voltage VDD line and the data node 310 line. The gate of the MP14 transistor may be connected to the inverted clock signal CKN line, and the gate of the MP15 transistor may be connected to the first signal IS1 line.

The transistors of the third stack 313b may include NMOS transistors MN11, MN15, and MN16 connected to the data node 310 line and the ground voltage VSS line. The MN11 transistor may be connected between the data node 310 line and a node 810 line to which the MN15 and MN16 transistors are connected in parallel, and the gate of the MN11 transistor may be connected to the inverted clock signal CKN line. The MN15 and MN16 transistors may be connected between the node 810 line, to which the MN15 and MN16 transistors are connected in parallel, and the ground voltage VSS line, and a gate of the MN15 transistor may be connected to the inverted scan enable signal SEN line, and a gate of the MN16 transistor may be connected to the scan input signal SI line.

The transistors of the fourth stack 314b may include NMOS transistors MN12, MN13, and MN17 connected in series between the data node 310 line and the ground voltage VSS line. The gate of the MN12 transistor may be connected to the third signal IS2N line, the gate of the MN13 transistor may be connected to the first signal IS1 line, and a gate of the MN17 transistor may be connected to the clock signal CK line.

The fifth stack 316 of transistors may include PMOS transistors MP17, MP18, and MP19 connected in series between the power supply voltage VDD line and the data node 310 line. A gate of the MP17 transistor may be connected to the clock signal CK line, a gate of the MP18 transistor may be connected to the scan input signal SI line, and a gate of the MP19 transistor may be connected to the inverted scan enable signal SEN line.

The inverter 315 may include the PMOS transistor MP16 and the NMOS transistor MN14 connected between the power supply voltage VDD line and the ground voltage VSS line. Gates of the MP16 transistor and the MN14 transistor may be connected to the data node 310 line, and the connection node between the MP16 transistor and the MN14 transistor may be connected to the first signal IS1 line. The inverter 315 may invert the signal of the data node 310 and output it to the first signal IS1 line.

The second signal generation circuit 200 may be configured in the same manner as the second signal generation circuit 200 of FIG. 3. The second signal generation circuit 200 may include PMOS transistors MP21 and MP22 connected in parallel between the power supply voltage VDD line and the second signal IS2 line, and first and second stacks 321 and 322 of transistors connected between the second signal IS2 line and the ground voltage VSS line and between the first signal IS1 line and the ground voltage VSS line. The gate of the MP21 transistor may be connected to the first signal IS1 line, and the gate of the MP22 transistor may be connected to the clock signal CK line.

The first stack 321 of transistors may include NMOS transistors MN21, MN22, and MN23 connected in series between the second signal IS2 line and the ground voltage VSS line. The gate of the MN21 transistor may be connected to the data input signal D line, the gate of the MN22 transistor may be connected to the first signal IS1 line, and the gate of the MN23 transistor may be connected to the clock signal CK line.

The second stack 322 of transistors may include a PMOS transistor 201 and NMOS transistors 203, MN24, MN25, and MN26, which are connected to the first signal IS1 line, the second signal IS2 line, and the ground voltage VSS line, respectively. The PMOS transistor 201 and the NMOS transistor 203 may be connected in series between the first signal IS1 line and the ground voltage VSS line, and gates of the PMOS transistor 201 and the NMOS transistor 203 may be connected to the inverted clock signal CKN line. The fourth signal IS1P may be output to the connection node 26 line between the PMOS transistor 201 and the NMOS transistor 203. The MN24 transistor may be connected between the second signal IS2 line and a node 320 line to which MN25 and MN26 transistors are connected in parallel, and a gate of the MN24 transistor may be connected to the fourth signal IS1P line. The MN25 and MN26 transistors may be connected between the node 320 line, to which the MN25 and MN26 transistors are connected in parallel, and the ground voltage VSS line, the gate of the MN25 transistor may be connected to the data input signal D line, and the gate of the MN26 transistor may be connected to the third signal IS2N line.

According to embodiments, the second signal generation circuit 200 may be replaced with the second signal generation circuits 200_5, 200_6, 200_7, 200_8, 200_9 described in FIGS. 5 to 9 to implement in various modifications.

The third signal generation circuit 300b may include PMOS transistors MP32 and MP33 connected in parallel between the power supply voltage VDD line and the third signal IS2N line, and NMOS transistors MN32 and MN33 connected in series between the third signal IS2N line and the ground voltage VSS line. Gates of the MP32 transistor and the MN32 transistor may be connected to the second signal IS2 line, and gates of the MP33 transistor and the MN33 transistor may be connected to the inverted scan enable signal SEN line, and the third signal IS2N may be output to a connection node line among the MP32, MP33, and MN32 transistors.

The second signal IS2 line may be connected to the input terminal of the latch circuit 402 of the output circuit 400, and the latch circuit 402 may latch the logic level of the second signal IS2 in response to the logic high level of the clock signal CK, and output the output signal Q. The inverter 404 may receive the output signal Q of the latch circuit 402 and output the inverted output signal QN.

Referring to FIG. 16 in connection with FIG. 15, the flipflop circuit 10b may operate in the scan test mode by the logic high level of the scan enable signal SE. The flipflop circuit 10b may operate in the normal mode by the logic low level of the scan enable signal SE. In the normal mode, the flipflop circuit 10b may operate in the same manner as the timing diagram of the operation of FIG. 4 described above.

The clock signal CK may be received by the flipflop circuit 10b, and the inverted scan enable signal SEN may become the logic low level according to the scan enable signal SE of the logic high level. Before a time point T1, the inverted clock signal CKN may be the logic high level according to the logic low level of the clock signal CK. In the first signal generation circuit 100b, the MP17, MP18, and MP19 transistors may be turned on by the logic low level of the clock signal CK, the scan input signal SI, and the inverted scan enable signal SEN, so that the data node 310 line may become the logic high level, and the first signal IS1 may become the logic low level. In the second signal generation circuit 200, the NMOS transistor 203 may be turned on by the logic high level of the inverted clock signal CKN, so that the fourth signal IS1P may become the logic low level. In the second signal generation circuit 200, the MP21 and MP22 transistors may be turned on by the logic low level of the first signal IS1 and the clock signal CK, so that the second signal IS2 may become the logic high level. In the third signal generation circuit 300, the MP33 transistor may be turned on by the logic low level of the inverted scan enable signal SEN of, so that the third signal IS2N may become the logic high level.

At a time point T1, the output signal Q of the logic low level and the inverted output signal QN of the logic high level may be output, based on the logic low level of the scan input signal SI synchronized with the rising edge of the clock signal CK. The inverted clock signal CKN may be transitioned to the logic low level according to the rising edge of the clock signal CK. In the first signal generation circuit 100, the MP14 and MP15 transistors may be turned on by the logic low level of the inverted clock signal CKN and the first signal IS1, so that the data node 310 line may become the logic high level, and the first signal IS1 may be maintained at the logic low level. In the second signal generation circuit 200, the MP21 transistor may be turned on by the logic low level of the first signal IS1, so that the second signal IS2 may be maintained at the logic high level. In the third signal generation circuit 300, the MP33 transistor may be turned on by the logic low level of the inverted scan enable signal SEN, so that the third signal IS2N may also be maintained at the logic high level. The output circuit 400 may latch the second signal IS2 of the logic high level in response to the rising edge of the clock signal CK, thereby outputting the output signal Q of the logic low level and the inverted output signal QN of the logic high level.

At a time point T2, the inverted clock signal CKN may be transitioned to the logic high level according to the falling edge of the clock signal CK. In the first signal generation circuit 100, the MP17, MP18, and MP19 transistors may be turned on by the logic low level of the clock signal CK, the scan input signal SI, and the inverted scan enable signal SEN, so that the data node 310 line may become the logic high level, and the first signal IS1 may be maintained at the logic low level. In the second signal generation circuit 200, the NMOS transistor 203 may be turned on by the logic high level of the inverted clock signal CKN, so that the fourth signal IS1P may be maintained at the logic low level. In the second signal generation circuit 200, the MP22 transistor may be turned on by the logic low level of the clock signal CK, so that the second signal IS2 may be maintained at the logic high level. In the third signal generation circuit 300, the third signal IS2N may also be maintained at the logic low level. The output circuit 400 may maintain the output signal Q of the logic low level and the inverted output signal QN of the logic high level.

At a time point T3, the scan input signal SI may be transitioned from the logic low level to the logic high level. At this time, in the first signal generation circuit 100, the MN11 and MN16 transistors may be turned on by the logic high level of the inverted clock signal CKN and the scan input signal SI, so that the data node 310 line may become the logic low level, and the first signal IS1 may be transitioned from the logic low level to the logic high level.

At a time point T4, the output signal Q of the logic high level and the inverted output signal QN of the logic low level may be output, based on the logic high level of the scan input signal SI synchronized with the rising edge of the clock signal CK. The inverted clock signal CKN may be transitioned to the logic low level according to the rising edge of the clock signal CK. In the first signal generation circuit 100, the MN12, MN13, and MN17 transistors may be turned on by the logic high level of the third signal IS2N, the first signal IS1, and the clock signal CK, so that the data node 310 line may become the logic low level, and the first signal IS1 may be maintained at the logic high level. In the second signal generation circuit 200, the PMOS transistor 201 may be turned on by the logic low level of the inverted clock signal CKN, so that the fourth signal IS1P may be transitioned to the logic high level of the same logic level as the first signal IS1. In the second signal generation circuit 200, the MN24 and MN26 transistors may be turned on by the logic high level of the fourth signal IS1P and the third signal IS2N, so that the second signal IS2 may be transitioned from the logic high level to the logic low level. In the third signal generation circuit 300, the MP32 and MP33 transistors may be turned on by the logic low level of the inverted scan enable signal SEN and the second signal IS2, so that the third signal IS2N may also be maintained at the logic high level. The output circuit 400 may latch the second signal IS2 of the logic low level in response to the rising edge of the clock signal CK, so that the output signal Q of the logic high level and the inverted output signal QN of the logic low level may be output.

At a time point T5, the inverted clock signal CKN may be transitioned to the logic high level according to the falling edge of the clock signal CK. In the first signal generation circuit 100, the MN11 and MN16 transistors may be turned on by the logic high level of the inverted clock signal CKN and the scan input signal SI, so that the data node 310 line may become the logic low level, and the first signal IS1 may be maintained at the logic high level. In the second signal generation circuit 200, the NMOS transistor 203 may be turned on by the logic high level of the inverted clock signal CKN, so that the fourth signal IS1P may be transitioned from the logic high level to the logic low level. In the second signal generation circuit 200, the MP22 transistor may be turned on by the logic low level of the clock signal CK, so that the second signal IS2 may be transitioned from the logic low level to the logic high level. In the third signal generation circuit 300, the MP32 transistor may be turned on by the logic low level of the inverted scan enable signal SEN, so that the third signal IS2N may also be maintained at the logic high level. The output circuit 400 may maintain the output signal Q of the logic high level and the inverted output signal QN of the logic low level.

Figure 17:
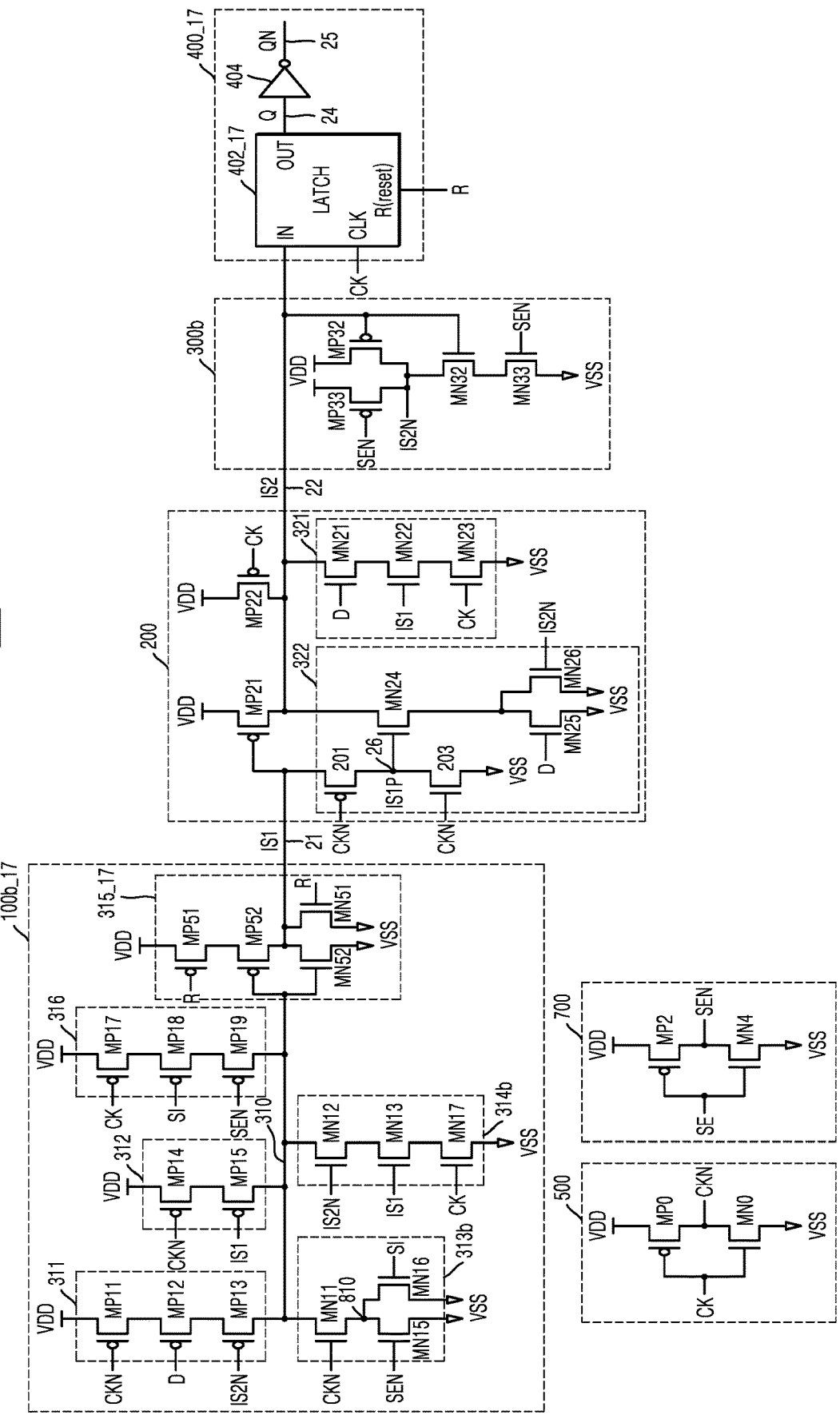
FIG. 17 is a diagram illustrating a modified example of the flipflop circuit of FIG. 15.

FIG. 17 is a diagram illustrating a modified example of the flipflop circuit 10*b* of FIG. 15.

Referring to FIG. 17, the flipflop circuit 10*b* may reset the first signal IS1 and the output signal Q to the logic low level in response to the reset signal R. A first signal generation circuit 100*b*_17 may include a NOR gate circuit 315_17 that inputs the reset signal R and the data node 310 signal instead of the inverter 315 of FIG. 15. The NOR gate circuit 315_17 may be configured in the same manner as the NOR gate circuit 315_10 of FIG. 10, and may reset the first signal IS1 to the logic low level in response to the logic high level of the reset signal R. In an output circuit 400_17, a latch circuit 402_17 may further include a reset terminal receiving the reset signal R, and may reset the output signal Q to the logic low level in response to the logic high level of the reset signal R. Accordingly, the inverted output signal QN may be output at the logic high level.

Figure 18:
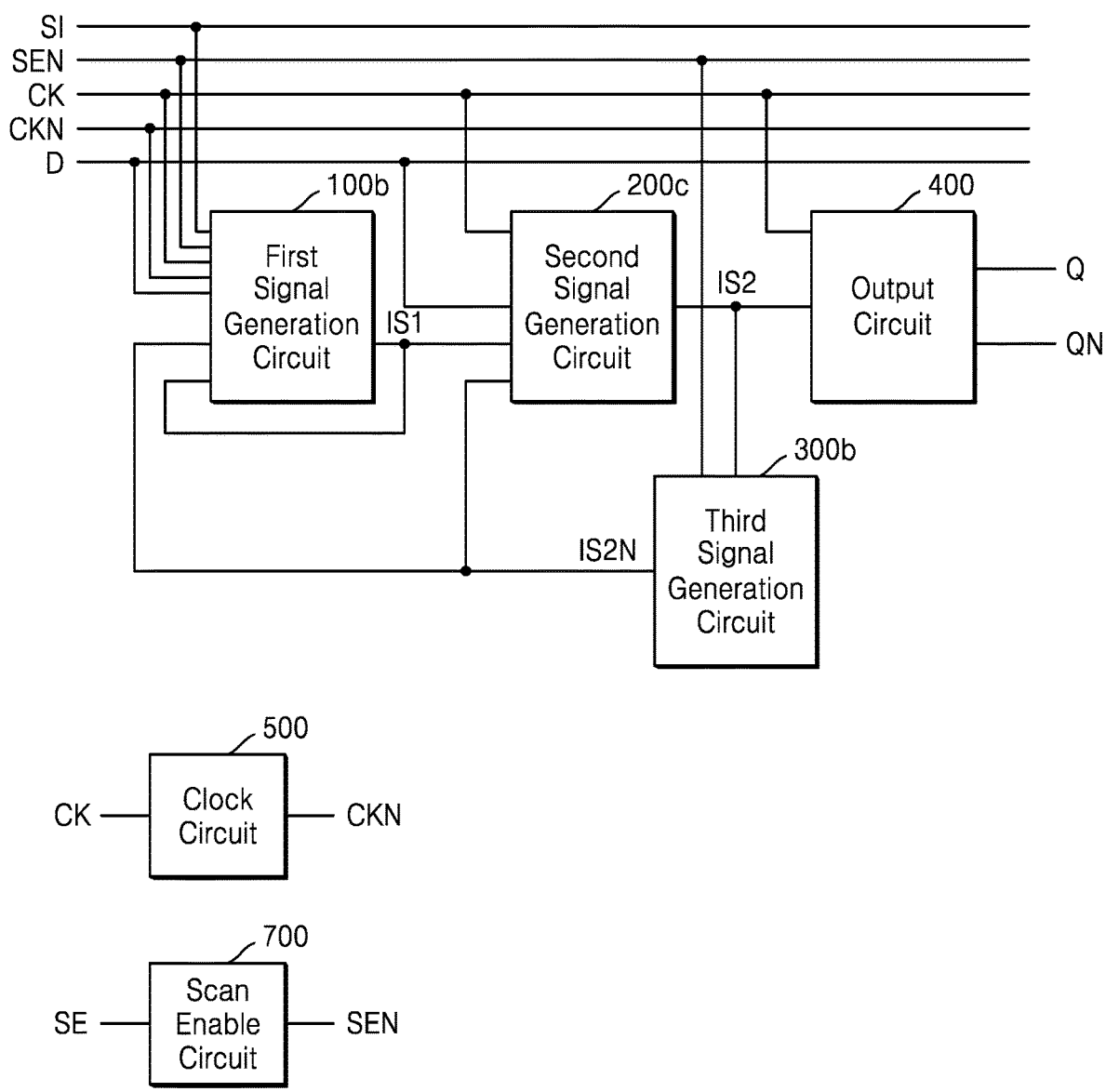
FIGS. 18 and 19 are diagrams of a fourth example illustrating a flipflop circuit according to an embodiment.
Figure 19:
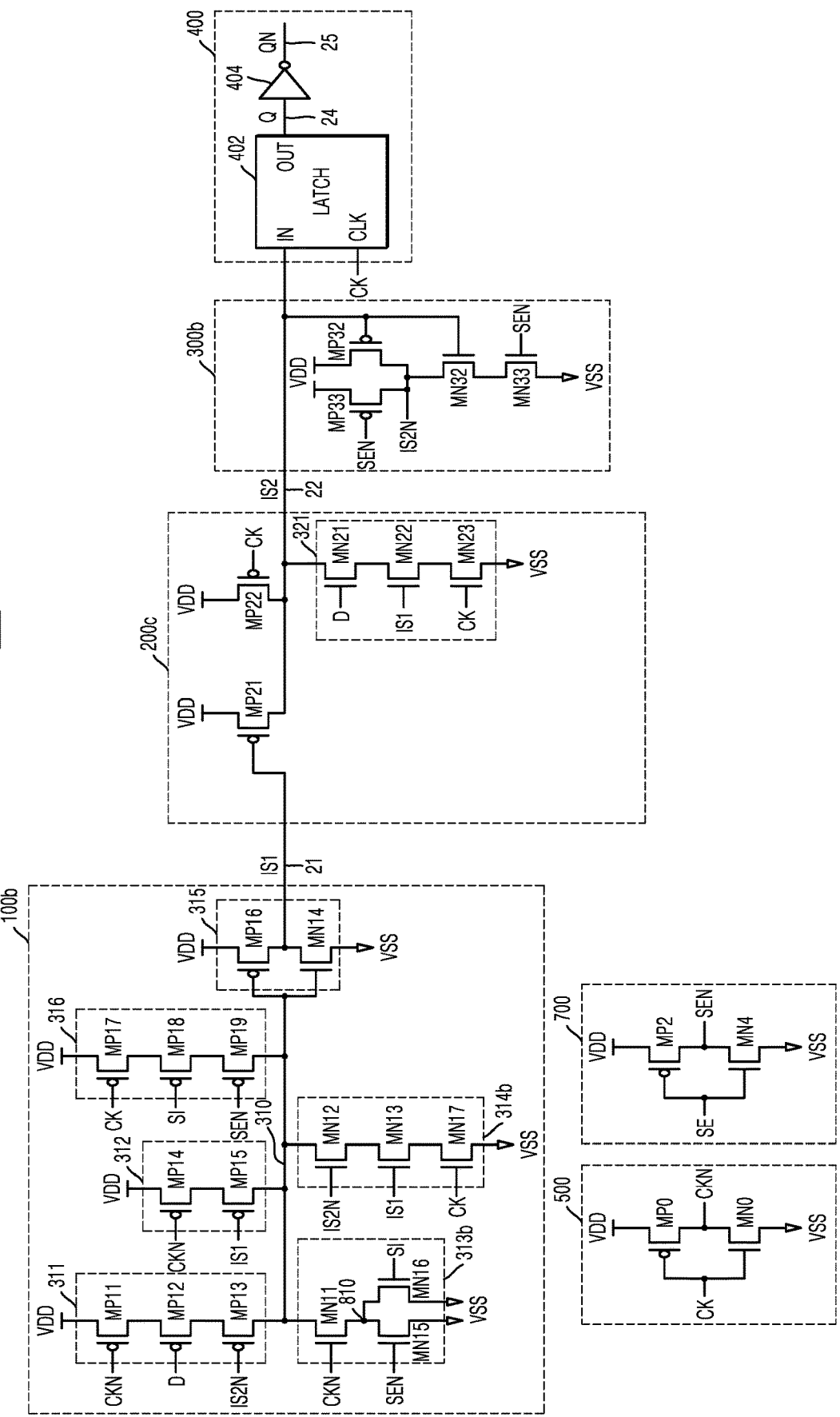

FIGS. 18 and 19 are diagrams of a fourth example illustrating a flipflop circuit according to an embodiment. FIG. 19 is a circuit diagram of the flipflop circuit 10*c* of FIG. 18. The flipflop circuit 10*c* of FIG. 18 may be different from the flipflop circuit 10*b* of FIG. 13 in that a second signal generation circuit 200*c* may not be connected to the inverted clock signal CKN line. Hereinafter, descriptions of the flipflop circuit 10*c* that overlap those of FIGS. 13 and 15 will be omitted.

Referring to FIG. 18, the second signal generation circuit 200*c* may receive the clock signal CK, the data input signal D, the first signal IS1, and the third signal IS2N, and generate the second signal IS2. The second signal generation circuit 200c may be configured to discharge the second signal IS2 line to which the second signal IS2 may be output by using the first signal IS1.

Referring to FIG. 19, the second signal generation circuit 200c may not include the second stack 322 of transistors connected between the second signal IS2 line and the ground voltage VSS line and between the first signal IS1 line and the ground voltage VSS line, compared to the second signal generation circuit 200 of FIG. 15. The second signal generation circuit 200c may include the MP21 and MP22 transistors and the MN21, MN22, and MN23 transistors of the first stack 321.

Figure 20:
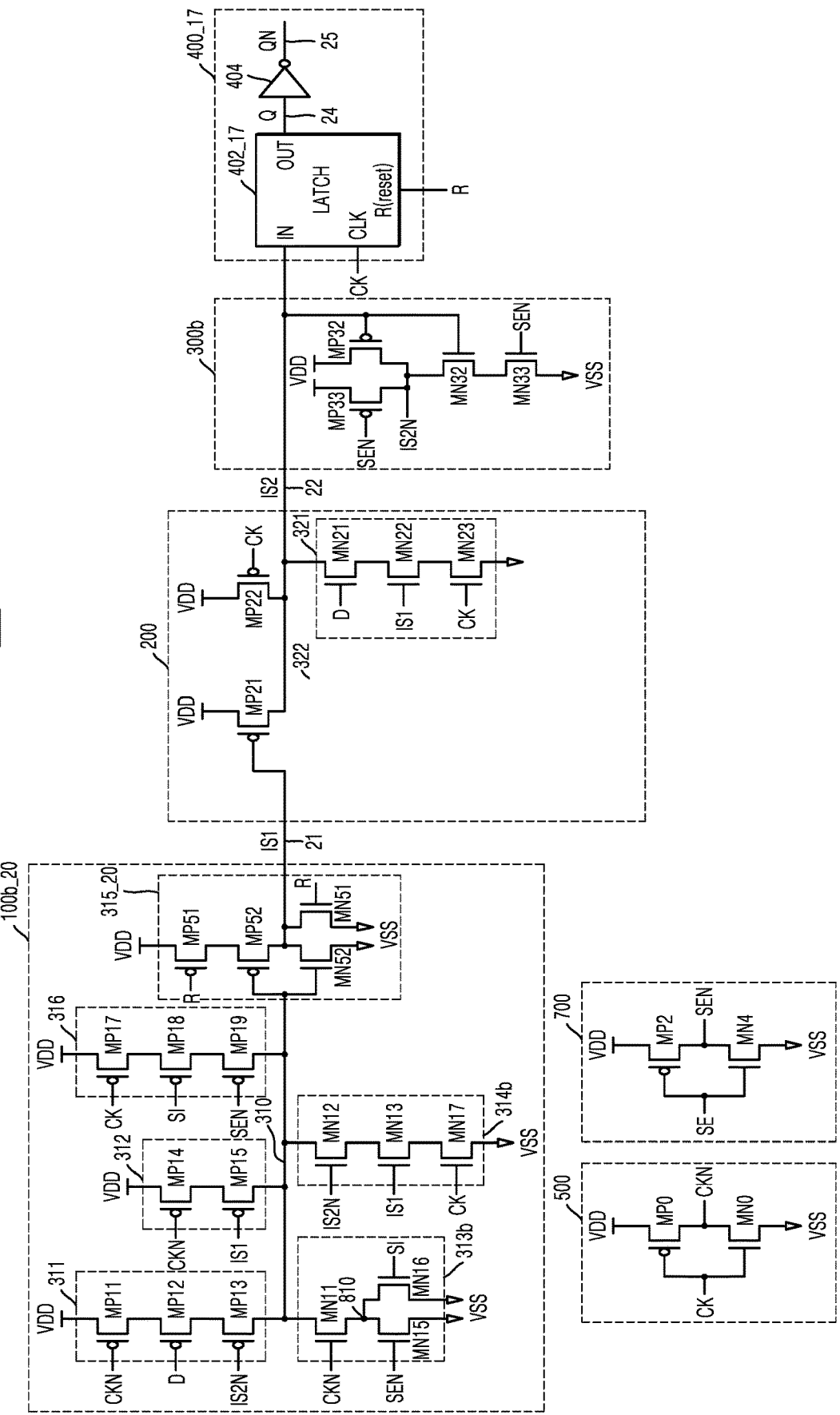
FIG. 20 is a diagram illustrating a modified example of the flipflop circuit of FIG. 19.

FIG. 20 is a diagram illustrating a modified example of the flipflop circuit 10c of FIG. 19.

Referring to FIG. 20, the flipflop circuit 10c may reset the first signal IS1 and the output signal Q to the logic low level in response to the reset signal R. A first signal generation circuit 100b_20 may include a NOR gate circuit 315_20 that inputs the reset signal R and the data node 310 signal instead of the inverter 315 of FIG. 19. The NOR gate circuit 315_20 may be configured in the same manner as the NOR gate circuit 315_10 of FIG. 10, and may reset the first signal IS1 to the logic low level in response to the logic high level of the reset signal R. In an output circuit 400_17, a latch circuit 402_17 may further include the reset terminal receiving the reset signal R, and may reset the output signal Q to the logic low level in response to the logic high level of the reset signal R. Accordingly, the inverted output signal QN may be output at the logic high level.

While the inventive concept has been particularly shown and described with reference to embodiments thereof, it will be understood that various changes in form and details may be made therein without departing from the spirit and scope of the inventive concept.

What is claimed is:

1. A flipflop circuit comprising:
   a clock circuit configured to receive a clock signal, and output an inverted clock signal;
   a first signal generation circuit configured to receive the inverted clock signal, a data input signal, a first signal, and a third signal, and generate the first signal;
   a second signal generation circuit configured to receive the clock signal, the inverted clock signal, the data input signal, the first signal, and the third signal, and generate a second signal;
   a third signal generation circuit configured to receive the second signal, and generate the third signal; and
   an output circuit configured to receive the clock signal and the second signal, and output an output signal and an inverted output signal,
   wherein the second signal generation circuit is configured to discharge a second signal line to which the second signal is output, by using a fourth signal derived from the first signal.

2. The flipflop circuit of claim 1, wherein the first signal generation circuit comprises a first complex gate connected to a first signal line to which the first signal is output, and
   wherein the first complex gate comprises:
      an OR gate comprising a first input configured to receive the data input signal, a second input configured to receive the third signal, and an output;
      an AND gate comprising a first input configured to receive the output of the OR gate, a second input configured to receive the first signal, and an output;
      a NOR gate comprising a first input configured to receive the output of the AND gate, a second input configured to receive the inverted clock signal, and an output; and
      a first inverter configured to receive the output of the NOR gate, and output the first signal, an output of the first inverter being connected to the first signal line.

3. The flipflop circuit of claim 2, wherein the second signal generation circuit comprises a second complex gate connected to the first signal line and the second signal line, a P-type metal-oxide-semiconductor (PMOS) transistor and an N-type metal-oxide-semiconductor (NMOS) transistor, and
   wherein the second complex gate comprises:
      a first AND gate comprising a first input configured to receive the first signal, a second input configured to receive the clock signal, a third input configured to receive the data input signal, and an output;
      an OR gate comprising a first input configured to receive the data input signal, a second input configured to receive the third signal, and an output,
      a second AND gate comprising a first input configured to receive the output of the OR gate, a second input configured to receive the fourth signal, and an output; and
      a NOR gate comprising a first input configured to receive the output of the first AND gate, a second input configured to receive the output of the second AND gate, and an output, the output of the NOR gate being connected to the second signal line,
   wherein the PMOS transistor and the NMOS transistor are connected in series between the first signal line and a ground voltage line, and gates of the PMOS transistor and the NMOS transistor are configured to receive the inverted clock signal, and
   wherein a connection node between the PMOS transistor and the NMOS transistor is connected to a fourth signal line to which the fourth signal is output.

4. The flipflop circuit of claim 3, wherein the third signal generation circuit comprises a second inverter connected to the second signal line and a third signal line to which the third signal is output, and
   wherein the second inverter is configured to receive the second signal, and output the third signal, and an output of the second inverter is connected to the third signal line.

5. The flipflop circuit of claim 4, wherein the output circuit comprises:
   a latch circuit configured to latch an inverted logic level of a logic level of the second signal in response to a rising edge of the clock signal, and output the output signal; and
   a third inverter configured to receive the output signal, and output the inverted output signal.

6. The flipflop circuit of claim 1, wherein the first signal generation circuit comprises first to fourth stacks of transistors and a first inverter, the first to fourth stacks of transistors being connected to a data node line,
   wherein the first stack of transistors comprises first to third P-type metal-oxide-semiconductor (PMOS) transistors connected in series between a power supply voltage line and the data node line, and gates of the first to third PMOS transistors are configured to respectively receive the inverted clock signal, the data input signal, and the third signal,
   wherein the second stack of transistors comprises fourth and fifth PMOS transistors connected in series between the power supply voltage line and the data node line, and gates of the fourth and fifth PMOS transistors are configured to respectively receive the inverted clock signal and the first signal, wherein the third stack of transistors comprises a first N-type metal-oxide-semiconductor (NMOS) transistor connected between the data node line and a ground voltage line, and a gate of the first NMOS transistor is configured to receive the inverted clock signal, wherein the fourth stack of transistors comprise second and third NMOS transistors connected in series between the data node line and the ground voltage line, and gates of the second and third NMOS transistors are configured to respectively receive the third signal and the first signal, and wherein the first inverter comprises a sixth PMOS transistor and a fourth NMOS transistor connected between the power supply voltage line and the ground voltage line, and gates of the sixth PMOS transistor and the fourth NMOS transistor are connected to the data node line, and a connection node between the sixth PMOS transistor and the fourth NMOS transistor is connected to a first signal line to which the first signal is output.

7. The flipflop circuit of claim 6, wherein, in the first signal generation circuit, the first inverter is connected to a seventh PMOS and a fifth NMOS to form a NOR gate which is configured to provide the first signal to the first signal line in response to a signal of the data node line and a reset signal.

8. The flipflop circuit of claim 6, wherein the second signal generation circuit comprises fifth and sixth stacks of transistors, and seventh and eighth PMOS transistors connected between the first signal line and a second signal line to which the second signal is output, wherein the seventh and eighth PMOS transistors are connected in parallel between the power supply voltage line and the second signal line, and gates of the seventh and eighth PMOS transistors are configured to respectively receive the first signal and the clock signal, wherein the fifth stack of transistors comprises fifth to seventh NMOS transistors connected in series between the second signal line and the ground voltage line, and gates of the fifth to seventh NMOS transistors are configured to respectively receive the data input signal, the first signal, and the clock signal, wherein the sixth stack of transistors comprises a ninth PMOS transistor and eighth to eleventh NMOS transistors respectively connected to the first signal line, the second signal line, and the ground voltage line, wherein the ninth PMOS transistor and the eighth NMOS transistor are connected in series between the first signal line and the ground voltage line, gates of the ninth PMOS transistor and the eighth NMOS transistor are connected to the inverted clock signal, and a connection node between the ninth PMOS transistor and the eighth NMOS transistor is connected to a fourth signal line to which the fourth signal is output, wherein the ninth NMOS transistor is connected between the second signal line and a node line to which the tenth and eleventh NMOS transistors are connected in parallel, and a gate of the ninth NMOS transistor is connected to the fourth signal line, and wherein the tenth and eleventh NMOS transistors are connected between the node line, to which the tenth and eleventh NMOS transistors are connected in parallel, and the ground voltage line, and gates of the tenth and eleventh NMOS transistors are configured to respectively receive the data input signal and the third signal.

9. The flipflop circuit of claim 8, wherein the second signal generation circuit further comprises an NMOS transistor connected in parallel to the ninth PMOS transistor, and a gate of the NMOS transistor is configured to receive the clock signal.

10. The flipflop circuit of claim 8, wherein, in the second signal generation circuit, the ninth PMOS transistor is replaced with an NMOS transistor, and a gate of the NMOS transistor is configured to receive the clock signal.

11. The flipflop circuit of claim 8, wherein the third signal generation circuit comprises a second inverter connected to the second signal line and a third signal line to which the third signal is output, wherein the second inverter comprises a tenth PMOS transistor and a twelfth NMOS transistor connected between the power supply voltage line and the ground voltage line, and wherein gates of the tenth PMOS transistor and the twelfth NMOS transistor are connected to the second signal line, and a connection node between the tenth PMOS transistor and the twelfth NMOS transistor is connected to the third signal line.

12. The flipflop circuit of claim 11, wherein the output circuit comprises:
   a latch circuit configured to latch an inverted logic level of the second signal in response to a rising edge of the clock signal, and output the output signal; and
   a third inverter configured to receive the output signal, and output the inverted output signal.

13. The flipflop circuit of claim 12, wherein the latch circuit is configured to receive a reset signal and reset the output signal.

14. The flipflop circuit of claim 6, wherein the second signal generation circuit comprises a fifth stack of transistors, and seventh and eighth PMOS transistors connected between the first signal line and the second signal line to which the second signal is output, wherein the seventh and eighth PMOS transistors are connected in parallel between the power supply voltage line and the second signal line, and gates of the seventh and eighth PMOS transistors are configured to respectively receive the first signal and the clock signal, and wherein the fifth stack of transistors comprising a ninth PMOS transistor and eighth to eleventh NMOS transistors respectively connected to the first signal line, the second signal line, and the ground voltage line, wherein the ninth PMOS transistor and the eighth NMOS transistor are connected in series between the first signal line and the ground voltage line, gates of the ninth PMOS transistor and the eighth NMOS transistor are configured to receive the inverted clock signal, and a connection node between the ninth PMOS transistor and the eighth NMOS transistor is connected to a fourth signal line to which the fourth signal is output, wherein the ninth NMOS transistor is connected between the second signal line and a node line to which the tenth and eleventh NMOS transistors are connected in parallel, and a gate of the ninth NMOS transistor is connected to the fourth signal line, and wherein the tenth and eleventh NMOS transistors are connected between the node line, to which the tenth and eleventh NMOS transistors are connected in parallel, and the ground voltage line, and gates of the tenth and eleventh NMOS transistors are connected to the data input signal and the third signal.

15. The flipflop circuit of claim 6, wherein the second signal generation circuit comprises a fifth stack of transistors, and seventh and eighth PMOS transistors connected between the first signal line and the second signal line to which the second signal is output,
  wherein the seventh and eighth PMOS transistors are connected in parallel between the power supply voltage line and the second signal line, a gate of the seventh PMOS transistor is configured to receive the fourth signal, and a gate of the eighth PMOS transistor is configured to receive the clock signal, and
  wherein the fifth stack of the transistors comprises a ninth PMOS transistor and eighth to eleventh NMOS transistors respectively connected to the first signal line, the second signal line, and the ground voltage line,
  wherein the ninth PMOS transistor and the eighth NMOS transistor are connected in series between the first signal line and the ground voltage line, gates of the ninth PMOS transistor and the eighth NMOS transistor are configured to receive the inverted clock signal, and a connection node between the ninth PMOS transistor and the eighth NMOS transistor is connected to a fourth signal line to which the fourth signal is output,
  wherein the ninth NMOS transistor is connected between the second signal line and a node line to which the tenth and eleventh NMOS transistors are connected in parallel, and a gate of the ninth NMOS transistor is connected to the fourth signal line, and
  wherein the tenth and eleventh NMOS transistors are connected between the node line, to which the tenth and eleventh NMOS transistors are connected in parallel, and the ground voltage line, and gates of the tenth and eleventh NMOS transistors are configured to respectively receive the data input signal and the third signal.

16. The flipflop circuit of claim 6, wherein the second signal generation circuit comprises fifth and sixth stacks of transistors, and seventh and eighth PMOS transistors connected between the first signal line and the second signal line to which the second signal is output,
  wherein the seventh and eighth PMOS transistors are connected in parallel between the power supply voltage line and the second signal line, a gate of the seventh PMOS transistor is configured to receive the fourth signal, and a gate of the eleventh PMOS transistor is configured to receive the clock signal,
  wherein the fifth stack of transistors comprises fifth to seventh NMOS transistors connected in series between the second signal line and the ground voltage line, and gates of the fifth to seventh NMOS transistors are configured to respectively receive the data input signal, the first signal, and the clock signal,
  wherein the sixth stack of transistors comprise a ninth PMOS transistor and eighth to eleventh NMOS transistors respectively connected to the first signal line, the second signal line, and the ground voltage line,
  wherein the ninth PMOS transistor and the eighth NMOS transistor are connected in series between the first signal line and the ground voltage line, gates of the ninth PMOS transistor and the eighth NMOS transistor are configured to receive the inverted clock signal, and a connection node between the ninth PMOS transistor and the eighth NMOS transistor is connected to a fourth signal line to which the fourth signal is output,
  wherein the ninth NMOS transistor is connected between the second signal line and a node line to which the tenth and eleventh NMOS transistors are connected in parallel, and a gate of the ninth NMOS transistor is connected to the fourth signal line, and
  wherein the tenth and eleventh NMOS transistors are connected between the node line, to which the tenth and eleventh NMOS transistors are connected in parallel, and the ground voltage line, and gates of the tenth and eleventh NMOS transistors are configured to respectively receive the data input signal and the third signal.

17. The flipflop circuit of claim 1, further comprising a multiplexer configured to receive the data input signal and a scan input signal,
  wherein the multiplexer is configured to select one of the data input signal and the scan input signal in response to a scan enable signal, output a selected signal as a multiplexer output signal, and provide the multiplexer output signal to a line to which the data input signal is input, and
  wherein the flipflop circuit is configured to output the output signal and the inverted output signal based on the data input signal in a normal mode, and output the output signal and the inverted output signal based on the scan input signal in a scan test mode.

18. A flipflop circuit comprising:
  a clock circuit configured to receive a clock signal, and output an inverted clock signal;
  a scan enable circuit configured to receive a scan enable signal, and output an inverted scan enable signal;
  a first signal generation circuit configured to receive a scan input signal, the inverted scan enable signal, the clock signal, the inverted clock signal, a data input signal, a first signal, and a third signal, and generate the first signal;
  a second signal generation circuit configured to receive the clock signal, the data input signal, the first signal, and the third signal and generate a second signal;
  a third signal generation circuit configured to receive the inverted scan enable signal and the second signal, and generate the third signal; and
  an output circuit configured to receive the clock signal and the second signal, and output an output signal and an inverted output signal,
  wherein the second signal generation circuit is configured to discharge a second signal line to which the second signal is output, by using the first signal.

19. The flipflop circuit of claim 18, wherein the first signal generation circuit comprises first to fifth stacks of transistors and a first inverter connected to a first signal line to which the first signal is output and a data node line,
  wherein the first stack of transistors comprises first to third P-type metal-oxide-semiconductor (PMOS) transistors connected in series between a power supply voltage line and the data node line, and gates of the first to third PMOS transistors are configured to respectively receive the inverted clock signal, the data input signal, and the third signal,
  wherein the second stack of transistors comprises fourth and fifth PMOS transistors connected in series between the power supply voltage line and the data node line, and gates of the fourth and fifth PMOS transistors are configured to respectively receive the inverted clock signal and the first signal,
  wherein the third stack of transistors comprises first to third N-type metal-oxide-semiconductor (NMOS) transistors respectively connected to the data node line and a ground voltage line, the first NMOS transistor is connected between the data node line and a node line to which the second and third NMOS transistors are connected in parallel, a gate of the first NMOS transistor is configured to receive the inverted clock signal, the second and third NMOS transistors are connected between the node line, to which the second and third MVOS transistors are connected in parallel, and the ground voltage line, and gates of the second and third NMOS transistors are configured to respectively receive the inverted scan enable signal and the scan input signal, wherein the fourth stack of transistors comprises fourth to sixth NMOS transistors connected in series between the data node line and the ground voltage line, and gates of the fourth to sixth NMOS transistors are configured to respectively receive the third signal, the first signal, and the clock signal, wherein the fifth stack of transistors comprises sixth to eighth PMOS transistors connected in series between the power supply voltage line and the data node line, and gates of the sixth to eighth PMOS transistors are configured to respectively receive the clock signal, the scan input signal, and the inverted scan enable signal, and wherein the first inverter is configured to receive a signal of the data node line, and output the first signal, and provide the first signal to the first signal line.

20. The flipflop circuit of claim 19, wherein, in the first signal generation circuit, the first inverter is connected to a ninth PMOS and a seventh NMOS to form a NOR gate which is configured to output the first signal in response to a signal of the data node line and a reset signal, and provide the first signal to the first signal line.

* * * * *